US012603263B2

(12) United States Patent
Meng et al.

(10) Patent No.: US 12,603,263 B2
(45) Date of Patent: Apr. 14, 2026

(54) APPARATUSES AND TECHNIQUES FOR CLEANING A MULTI-STATION SEMICONDUCTOR PROCESSING CHAMBER

(71) Applicant: Lam Research Corporation, Fremont, CA (US)

(72) Inventors: Xin Meng, Ontario, CA (US); Xinyi Chen, Beaverton, OR (US); Sreeram Sonti, San Diego, CA (US); Kevin Bertsch, Tigard, OR (US); Defu Liang, Wilsonville, OR (US); Zhuozhi Chen, Fremont, CA (US); Rohit Ode, Portland, OR (US); William Schlosser, Tigard, OR (US); Tongtong Guo, Beaverton, OR (US); Rachel E. Batzer, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/712,902

(22) PCT Filed: Nov. 21, 2022

(86) PCT No.: PCT/US2022/080277
§ 371 (c)(1),
(2) Date: May 23, 2024

(87) PCT Pub. No.: WO2023/097193
PCT Pub. Date: Jun. 1, 2023

(65) Prior Publication Data
US 2025/0022696 A1     Jan. 16, 2025

Related U.S. Application Data

(60) Provisional application No. 63/264,457, filed on Nov. 23, 2021.

(51) Int. Cl.
*H01J 37/32* (2006.01)
(52) U.S. Cl.
CPC .. *H01J 37/32862* (2013.01); *H01J 37/32357* (2013.01); *H01J 37/32449* (2013.01); *H01J 37/32899* (2013.01); *H01J 2237/335* (2013.01)
(58) Field of Classification Search
CPC .......... C23C 16/4405; C23C 16/45563; C23C 16/45589; H01J 2237/335;
(Continued)

(56) References Cited

U.S. PATENT DOCUMENTS

| | | | |
|---|---|---|---|
| 3,320,846 | A | 5/1967 | Michel |
| D278,883 | S | 5/1985 | Frieberg |

(Continued)

FOREIGN PATENT DOCUMENTS

| | | |
|---|---|---|
| JP | H05190517 A | 7/1993 |
| JP | 2015023138 A | 2/2015 |

(Continued)

OTHER PUBLICATIONS

Machine translation of KR2016-0116476A (Year: 2016).*

(Continued)

*Primary Examiner* — Douglas Lee
(74) *Attorney, Agent, or Firm* — Weaver Austin Villeneuve & Sampson LLP

(57) ABSTRACT

Systems and methods for redirecting cleaning chemistry flows within a multi-station semiconductor processing chamber are disclosed. In such systems, a cleaning chemistry flow, e.g., a plasma from a remote plasma generator, may be directed onto a hub of an indexer that is centrally mounted within the chamber. The hub may have features that cause the cleaning chemistry flows to be redirected in a radially outward direction. By rotating the hub and/or changing the relative elevational positions between the hub (Continued)

and a cleaning chemistry inlet that provides the cleaning chemistry, the cleaning chemistry may be redirected into different regions of the chamber, thereby allowing for a more thorough and complete cleaning process.

27 Claims, 18 Drawing Sheets

(58) Field of Classification Search
CPC ............. H01J 37/32357; H01J 37/3244; H01J 37/32449; H01J 37/32853; H01J 37/32862; H01J 37/32899; H01L 21/6719; H01L 21/68771; H01L 21/68792
See application file for complete search history.

(56) References Cited

U.S. PATENT DOCUMENTS

| | | | |
|---|---|---|---|
| 6,450,117 | B1 | 9/2002 | Murugesh et al. |
| 6,600,632 | B1 | 7/2003 | Prochazka et al. |
| D481,299 | S | 10/2003 | Fujioka |
| 6,663,025 | B1 | 12/2003 | Halsey, I et al. |
| D528,407 | S | 9/2006 | Schwab |
| 7,416,989 | B1 | 8/2008 | Liu et al. |
| D600,220 | S | 9/2009 | Sato |
| D692,747 | S | 11/2013 | Schwab |
| D925,480 | S | 7/2021 | Oe et al. |
| D962,183 | S | 8/2022 | Sugiura et al. |
| D962,184 | S | 8/2022 | Sugiura et al. |
| D1,053,157 | S | 12/2024 | Sato |
| D1,053,695 | S | 12/2024 | Kato et al. |
| D1,114,751 | S | 2/2026 | Guo et al. |
| 2005/0199184 | A1 | 9/2005 | Murugesh et al. |
| 2008/0038894 | A1 | 2/2008 | Rueger et al. |
| 2009/0127099 | A1* | 5/2009 | Mullapudi ............ C23C 14/352 204/192.12 |
| 2015/0030766 | A1* | 1/2015 | Lind .................... C23C 16/4412 137/561 A |
| 2017/0256416 | A1 | 9/2017 | Fischer et al. |
| 2018/0114700 | A1 | 4/2018 | Woo et al. |
| 2019/0341276 | A1 | 11/2019 | Chow et al. |
| 2025/0006514 | A1 | 1/2025 | Premakumar et al. |

FOREIGN PATENT DOCUMENTS

| | | | | |
|---|---|---|---|---|
| JP | 2019134124 | A | 8/2019 | |
| KR | 20070069122 | A | 7/2007 | |
| KR | 20080062339 | A | 7/2008 | |
| KR | 20160116476 | A * | 10/2016 | ....... H01L 21/02052 |
| TW | 418065 | | 1/2001 | |
| TW | 201705185 | A | 2/2017 | |
| TW | D211363 | | 5/2021 | |
| TW | D211363 | S | 5/2021 | |
| WO | WO-2021185915 | A1 | 9/2021 | |

OTHER PUBLICATIONS

CN Office Action dated Aug. 16, 2024 in CN Application No. 202280089859.7 with English translation.
CN Office Action dated Jan. 29, 2024 in CN Application No. 202230216489.1, with English Translation.
CN office action dated Jul. 20, 2023, in application No. CN202230216489.1 with English Translation.
International Preliminary Report on Patentability and Written Opinion dated Jun. 6, 2024 in PCT Application No. PCT/US2022/080277.

International Preliminary Report on Patentability and Written Opinion dated May 2, 2024 in PCT Application No. PCT/US2022/078259.
International Search Report and Written Opinion dated Apr. 7, 2023 in PCT Application No. PCT/US2022/080277.
International Search Report and Written Opinion dated Feb. 2, 2023, in Application No. PCT/US2022/078259.
JP Office Action dated Oct. 7, 2022, in Application No. JP2022-008426 with English translation.
JP Office Action dated Oct. 7, 2022, in Application No. JP2022-008426.
JP Office Action dated Oct. 7, 2022, in Application No. JP2022-008429 with English translation.
JP Office Action dated Oct. 7, 2022, in Application No. JP2022-008430 with English translation.
KR Office Action dated Nov. 28, 2022, in Application No. KR30-2022-0015219 with English translation.
KR Office Action dated Nov. 28, 2022, in Application No. KR30-2022-0015219.
KR Office Action dated Nov. 28, 2022, in Application No. KR30-2022-0015220 with English translation.
KR Office Action dated Nov. 28, 2022, in Application No. KR30-2022-0015220.
KR Office Action dated Nov. 28, 2022, in Application No. KR30-2022-0015221 with English translation.
KR Office Action dated Nov. 28, 2022, in Application No. KR30-2022-0015221.
KR Office Action dated Nov. 28, 2022, in Application No. KR30-2022-0015222 with English translation.
KR Office Action dated Nov. 28, 2022, in Application No. KR30-2022-0015222.
TW Notice of Allowances dated Aug. 23, 2024 in TW Application No. 108123893 with English translation.
TW Office Action dated Apr. 19, 2023 in Application No. TW108123893 with English Translation.
TW Office Action dated Aug. 31, 2022 In Application No. TW111301839 with English translation.
TW Office Action dated Jul. 26, 2023 in Application No. TW108123893 with English Translation.
TW Office Action dated Jun. 30, 2023, in application No. TW111301837 with English translation.
TW Office Action dated Mar. 9, 2023 in Application No. TW111301839 With English translation.
TW Office Action dated Mar. 29, 2023 in Application No. TW111301838 with English translation.
TW Office Action dated Mar. 30, 2023, in Application No. TW111301840 with English translation.
U.S. Appl. No. 29/811,957, Inventors Guo et al., filed Oct. 18, 2021.
EP Extended European Search report dated Sep. 26, 2025 in EP Application No. 22884629.1.
U.S. Ex Parte Quayle Action dated May 16, 2025 in U.S. Appl. No. 29/811,957.
US Non-Final Office Action dated Jul. 25, 2025 in U.S. Appl. No. 18/701,171.
U.S. Notice of Allowance dated Sep. 25, 2025 in U.S. Appl. No. 29/811,957.
U.S. Restriction Requirement dated Mar. 4, 2025 in U.S. Appl. No. 29/811,957.
KR Office Action dated Feb. 9, 2026 in KR Application No. 10-2024-7016356, with English Translation.
U.S. Appl. No. 19/552,683, inventors Premakumar H.K et al., filed on Feb. 27, 2026.
U.S. Appl. No. 30/039,644, inventors Guo T et al., filed on Dec. 24, 2025.
U.S. Notice of Allowance dated Mar. 10, 2026, in U.S. Appl. No. 18/701,171.

* cited by examiner

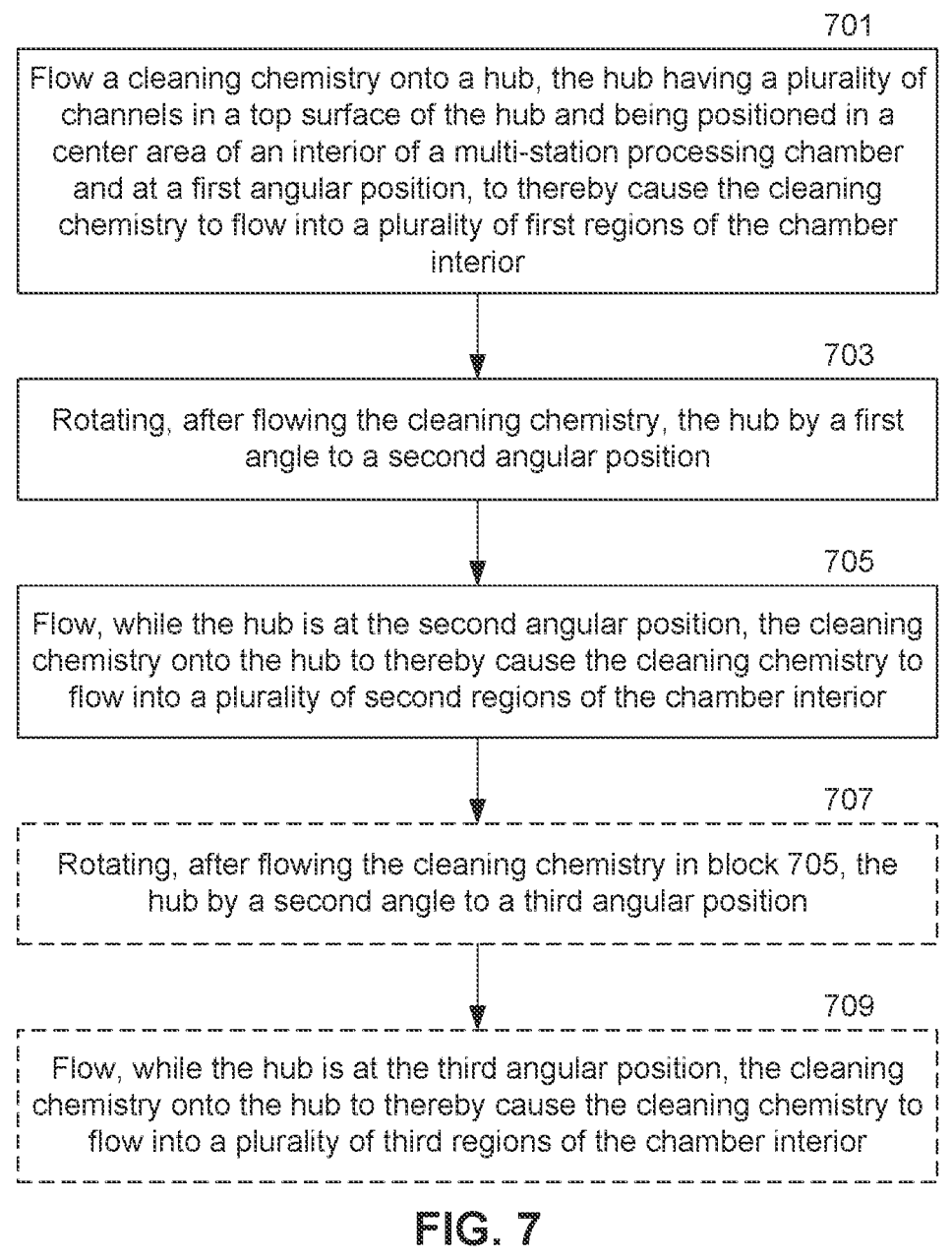

701

Flow a cleaning chemistry onto a hub, the hub having a plurality of channels in a top surface of the hub and being positioned in a center area of an interior of a multi-station processing chamber and at a first angular position, to thereby cause the cleaning chemistry to flow into a plurality of first regions of the chamber interior

703

Rotating, after flowing the cleaning chemistry, the hub by a first angle to a second angular position

705

Flow, while the hub is at the second angular position, the cleaning chemistry onto the hub to thereby cause the cleaning chemistry to flow into a plurality of second regions of the chamber interior

707

Rotating, after flowing the cleaning chemistry in block 705, the hub by a second angle to a third angular position

709

Flow, while the hub is at the third angular position, the cleaning chemistry onto the hub to thereby cause the cleaning chemistry to flow into a plurality of third regions of the chamber interior

FIG. 7

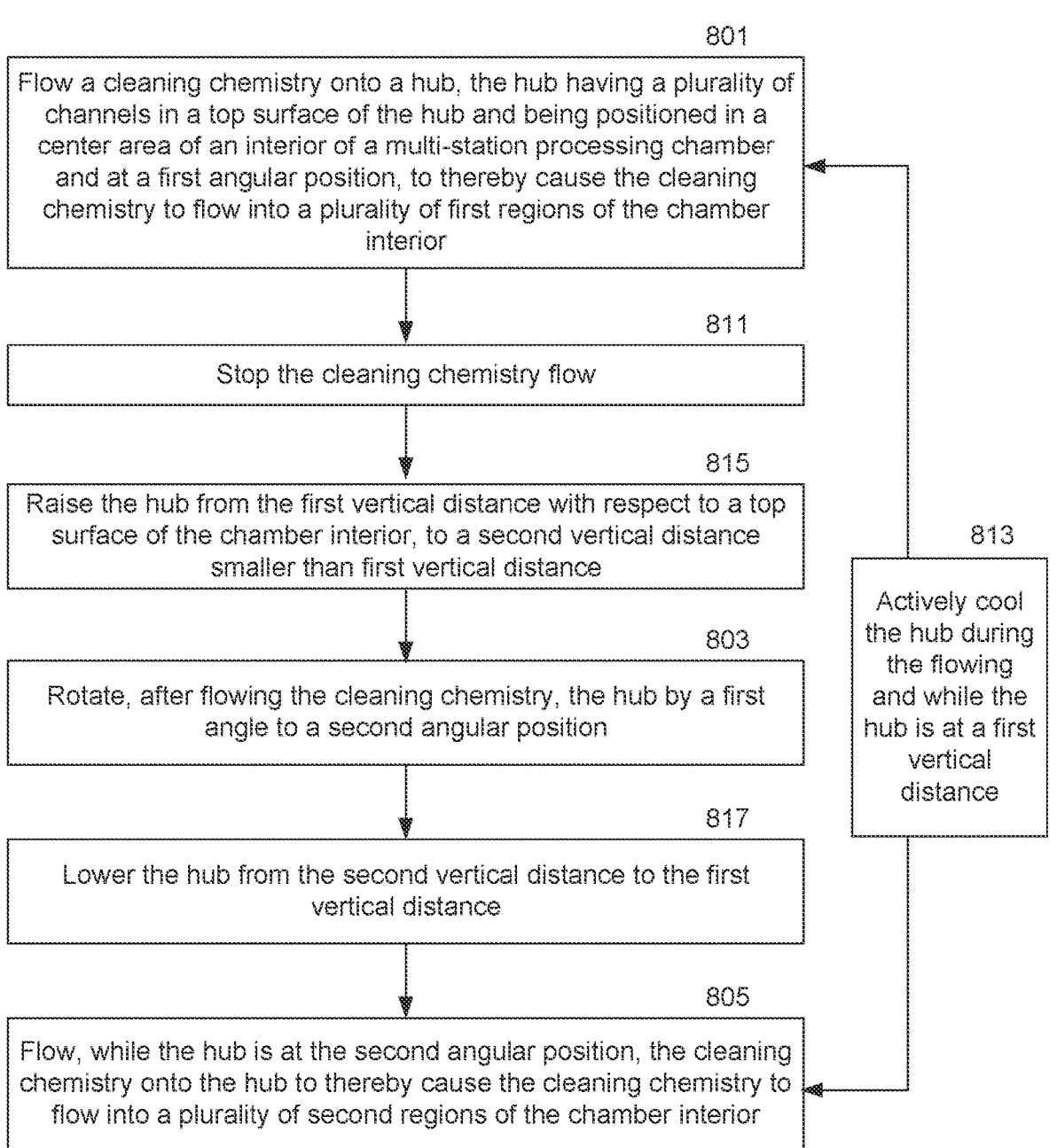

801
Flow a cleaning chemistry onto a hub, the hub having a plurality of channels in a top surface of the hub and being positioned in a center area of an interior of a multi-station processing chamber and at a first angular position, to thereby cause the cleaning chemistry to flow into a plurality of first regions of the chamber interior 811
Stop the cleaning chemistry flow 815
Raise the hub from the first vertical distance with respect to a top surface of the chamber interior, to a second vertical distance smaller than first vertical distance 803
Rotate, after flowing the cleaning chemistry, the hub by a first angle to a second angular position 817
Lower the hub from the second vertical distance to the first vertical distance 805
Flow, while the hub is at the second angular position, the cleaning chemistry onto the hub to thereby cause the cleaning chemistry to flow into a plurality of second regions of the chamber interior 813
Actively cool the hub during the flowing and while the hub is at a first vertical distance

FIG. 8

APPARATUSES AND TECHNIQUES FOR CLEANING A MULTI-STATION SEMICONDUCTOR PROCESSING CHAMBER

RELATED APPLICATION(S)

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

During some semiconductor processing operations, materials are deposited and removed from semiconductor substrates positioned in a processing chamber. These materials and other unwanted particulates and contaminants can become deposited on internal surfaces and features of the processing chamber, including the chamber walls and gas distribution devices, such as a showerhead. To maintain high throughput, low contamination, low particle, and fully functioning equipment after processing wafers in the processing chamber, the accumulated unwanted materials should be cleaned from the processing chamber's internal features.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some implementations, a method of cleaning a multi-station processing chamber is provided. The multi-station processing chamber may include a plurality of processing stations within a chamber interior, a hub located in a center area of the chamber interior, configured to rotate about a center axis, and having a plurality of channels in a top surface of the hub, and a cleaning chemistry inlet configured to direct a cleaning chemistry from a remote source into the chamber interior and onto the top surface of the hub. The method may include flowing, while the hub is at a first angular position with respect to the center axis, the cleaning chemistry from the remote source through the cleaning chemistry inlet and onto the top surface of the hub, and thereby causing the cleaning chemistry to flow through at least some channels in the plurality of channels and into a plurality of first regions within the chamber interior, where each channel of the at least some channels directs the cleaning chemistry flow into one corresponding first region. The method may further include rotating, after the flowing of the cleaning chemistry onto the hub while the hub is at the first angular position, the hub by a first angle to a second angular position with respect to the center axis and again flowing, while the hub is at the second angular position, the cleaning chemistry through the cleaning chemistry inlet and onto the top surface of the hub, thereby causing the cleaning chemistry to flow through at least some channels in the plurality of channels and into a plurality of second regions within the chamber interior, where each channel of the at least some channels directs the cleaning chemistry flow into one corresponding second region.

In some implementations, the method may further include positioning, before the flowing of the cleaning chemistry onto the top surface of the hub while the hub is at the first angular position, the hub at the first angular position with respect to the center axis.

In some implementations, the method may further include stopping, after the flowing of the cleaning chemistry onto the top surface of the hub while the hub is at the first angular position and before the rotating, the flowing of the cleaning chemistry onto the hub.

In some implementations, the method may further include raising, after the flowing of the cleaning chemistry onto the top surface of the hub while the hub is at the first angular position and before the rotating, the hub along the center axis such that a first vertical offset between the hub and a top of the multi-station processing chamber decreases to a second vertical offset smaller than the first vertical offset, rotating the hub while the hub is at the second vertical offset, and lowering, after the rotating, the hub along the center axis from the second vertical offset to the first vertical offset.

In some implementations, each processing station may include a substrate support structure and the method may further include raising, after the flowing of the cleaning chemistry onto the top surface of the hub while the hub is at the first angular position and before the rotating, each substrate support structure such that a third vertical offset between each substrate support structure and the top of the multi-station processing chamber decreases to a fourth vertical offset smaller than the third vertical offset, rotating the hub while the hub is at the second vertical offset and while each substrate support is at the fourth vertical offset, and lowering, after the rotating, each substrate support structure from the fourth vertical offset to the third vertical offset.

In some implementations, the method may further include rotating, after the flowing of the cleaning chemistry onto the top surface of the hub while the hub is at the second angular position, the hub by a second angle to a third angular position with respect to the center axis and flowing, while the hub is at the third angular position, the cleaning chemistry through the cleaning chemistry inlet and onto the top surface of the hub, and thereby causing the cleaning chemistry to flow through at least some channels of the plurality of channels and into a plurality of third regions within the chamber interior, where each channel directs the cleaning chemistry flow into one corresponding third region.

In some implementations, each first region may include a portion of a corresponding sidewall of the multi-station processing chamber.

In some implementations, the first angle may be a non-zero angle greater than 0 degrees and less than 90 degrees.

In some implementations, the first angle may be a non-zero angle greater than 0 degrees and less than or equal to about 45 degrees, or greater than about 60 degrees and less than about 90 degrees.

In some implementations, the method may further include actively cooling the hub during both the flowing while the hub is at the first angular position and the flowing while the hub is at the second angular position by flowing a heat transfer fluid into one or more internal cavities within the hub and causing the hub to be in thermal contact with a heat transfer section of the multi-station processing chamber.

In some implementations, the plurality of channels may include a first set of channels and a second set of channels, the channels in the first set of channels may be in a first circular array about the center axis, the channels in the second set of channels may be in a second circular array about the center axis, the channels in the first set of channels may each have a first cross-sectional profile in a corresponding plane that is coincident with, and parallel to, the center axis, the channels in the second set of channels may each have a second cross-sectional profile in a corresponding plane that is coincident with, and parallel to, the center axis, the first cross-sectional profiles may be different from the second cross-sectional profiles, the cleaning chemistry inlet may have a plurality of flow outlets that are configured to direct the cleaning chemistry along a plurality of flow paths that are each at least partially at an oblique angle to an axis parallel to the center axis, the flow outlets of the cleaning chemistry inlet may, in the first angular position, be aligned with the channels in the first set of channels, and the flow outlets of the cleaning chemistry inlet may, in the second angular position, be aligned with the channels in the second set of channels.

In some implementations, the hub may be part of an indexer having a plurality of indexer arms, each indexer arm extending outward from the hub, the channels in the first set of channels may be azimuthally aligned with the indexer arms, and the channels in the second set of channels may be azimuthally aligned with sectors in between the indexer arms.

In some implementations, the first cross-sectional profiles may be configured to direct the cleaning chemistry flowed from the cleaning chemistry inlet in a direction that has a radially outward component relative to the center axis and a component that is parallel to the center axis and oriented towards the cleaning chemistry inlet.

In some implementations, the second cross-sectional profiles may be configured to direct the cleaning chemistry flowed from the cleaning chemistry inlet in a direction that has a radially outward component relative to the center axis and, optionally, a component that is parallel to the center axis and oriented away from the cleaning chemistry inlet.

In some implementations, a system may be provided that includes a multi-station processing chamber with a plurality of side walls and a top that at least partially define a chamber interior, a plurality of processing stations within the chamber interior that each include a substrate support structure configured to support a substrate, a hub having a plurality of channels in a top surface of the hub, the hub located in a center area of the chamber interior, a hub positioning mechanism configured to rotate the hub about a center axis, a cleaning chemistry inlet configured to direct a flow of a cleaning chemistry into the chamber interior and onto the top surface of the hub; a remote cleaning chemistry source fluidically connected to the cleaning chemistry inlet and configured to flow the cleaning chemistry to the cleaning chemistry inlet; and a controller having at least one processor and at least one memory, in which the at least one memory stores instructions which, when executed by the at least one processor, cause the at least one processor to: cause, while the hub is at a first angular position with respect to the center axis, the cleaning chemistry to flow from the remote cleaning chemistry source through the cleaning chemistry inlet and onto the top surface of the hub, thereby causing the cleaning chemistry to flow through at least some channels of the plurality of channels and into a plurality of first regions within the chamber interior, in which each channel of the at least some channels directs the cleaning chemistry flow into one corresponding first region; cause, after the cleaning chemistry is flowed onto the hub while the hub is at the first angular position, the hub positioning mechanism to rotate the hub by a first angle to a second angular position with respect to the center axis; and cause, while the hub is at the second angular position, the cleaning chemistry to flow through cleaning chemistry inlet and onto the top surface of the hub, thereby causing the cleaning chemistry to flow through at least some channels of the plurality of channels and into a plurality of second regions within the chamber interior, in which each channel of the at least some channels directs the cleaning chemistry flow into one corresponding second region.

In some implementations, the one or more memories may further store instructions which, when executed by the at least one processor, further cause the at least one processor to cause, before the cleaning chemistry is flowed onto the top surface of the hub while the hub is at the first angular position, the hub positioning mechanism to position the hub at the first angular position with respect to the center axis.

In some implementations, the one or more memories may further store instructions which, when executed by the at least one processor, cause the at least one processor to cause, after the flowing of the cleaning chemistry onto the top surface of the hub while the hub is at the first angular position and before the rotating, the flow of the cleaning chemistry to stop flowing onto the hub.

In some implementations, the hub positioning mechanism may be further configured to raise and lower the hub along the center axis, and the one or more memories may further store instructions which, when executed by the at least one processor, cause the at least one processor to cause, after the cleaning chemistry is flowed onto the top surface of the hub while the hub is at the first angular position and before the hub is rotated, the hub positioning mechanism to raise the hub along the center axis such that a first vertical offset between the hub and the top of the multi-station processing chamber decreases to a second vertical offset smaller than the first vertical offset and the hub to be rotated from the first angular position to the second angular position while the hub is at the second vertical offset, and the one or more memories further store instructions which, when executed by the at least one processor, cause the at least one processor, cause, after the hub is rotated, the hub positioning mechanism to lower the hub along the center axis from the second vertical offset to the first vertical offset.

In some implementations, each substrate support structure may be configured to be raised and lowered along a respective center axis that extends through each substrate support structure, the one or more memories may further store instructions configured to cause, after the cleaning chemistry is flowed onto the hub while the hub is at the first angular position and before the hub is rotated, each substrate support structure to move upwards along each respective center axis such that a third vertical offset between each substrate support structure and the top of the multi-station processing chamber decreases to a fourth vertical offset smaller than the third vertical offset, the hub is rotated from the first angular position to the second angular position while the hub is at the second vertical offset and while each substrate support is at the fourth vertical offset, and the one or more memories may further store instructions which, when executed by the at least one processor, cause the at least one processor to cause, after the hub is rotated, each substrate support structure to move downwards from the fourth vertical offset to the third vertical offset.

In some implementations, the one or more memories may further store instructions which, when executed by the at least one processor, cause the at least one processor to cause, after the cleaning chemistry is flowed onto the hub while the hub is at the second angular position, the hub positioning mechanism to rotate the hub by a second angle to a third angular position with respect to the center axis and cause, while the hub is at the third angular position, the cleaning chemistry to flow through the cleaning chemistry inlet and onto the hub, and thereby cause the cleaning chemistry to flow through the at least some channels of the plurality of channels and into a plurality of third regions within the chamber interior, where each channel of the at least some channels of the plurality of channels directs the cleaning chemistry flow into one corresponding third region.

In some implementations, the hub may include four channels.

In some implementations, the hub may include eight channels.

In some implementations, the plurality of channels may include a first set of channels and a second set of channels, the channels in the first set of channels may be in a first circular array about the center axis, the channels in the second set of channels may be in a second circular array about the center axis, the channels in the first set of channels may each have a first cross-sectional profile in a corresponding plane that is coincident with, and parallel to, the center axis, the channels in the second set of channels may each have a second cross-sectional profile in a corresponding plane that is coincident with, and parallel to, the center axis, the first cross-sectional profiles may be different from the second cross-sectional profiles, the cleaning chemistry inlet may have a plurality of flow outlets that are configured to direct the cleaning chemistry along a plurality of flow paths that are each at least partially at an oblique angle to an axis parallel to the center axis, the flow outlets of the cleaning chemistry inlet may, in the first angular position, be aligned with the channels in the first set of channels, and the flow outlets of the cleaning chemistry inlet may, in the second angular position, be aligned with the channels in the second set of channels.

In some implementations, the hub may be part of an indexer having a plurality of indexer arms, each indexer arm extending outward from the hub, the channels in the first set of channels may be azimuthally aligned with the indexer arms, and the channels in the second set of channels may be azimuthally aligned with sectors in between the indexer arms.

In some implementations, the first cross-sectional profiles may be configured to direct the cleaning chemistry flowed from the cleaning chemistry inlet in a direction that has a radially outward component relative to the center axis and a component that is parallel to the center axis and oriented towards the cleaning chemistry inlet.

In some implementations, the second cross-sectional profiles may be configured to direct the cleaning chemistry flowed from the cleaning chemistry inlet in a direction that has a radially outward component relative to the center axis and, optionally, a component that is parallel to the center axis and oriented away from the cleaning chemistry inlet.

In some implementations, a multi-station processing chamber may be provided that includes a plurality of side walls and a top that at least partially define a chamber interior; a plurality of processing stations within the chamber interior, in which each processing station includes a substrate support structure configured to support a substrate; and a substrate movement mechanism located in a center area of the chamber interior and including: a plurality of arms arranged around a center axis, and a hub positioned above the plurality of arms and having a top surface with a plurality of channels arranged in a radial pattern around the center axis, in which: each channel extends along a pathway that extends in a radial direction from a center region of the hub to an edge of the hub, each channel has a cross-sectional area perpendicular to the corresponding pathway, and at least one of the channels has a cross-sectional area that is different than a cross-sectional area of another channel and/or that varies along the pathway.

In some implementations, the at least one channel may have a cross-sectional area with a first width that is substantially constant width along that channel's pathway, and at least one other channel may have a cross-sectional area with a second width that is smaller than the first width and that is substantially constant along that channel's pathway.

In some implementations, two channels of the plurality of channels may each have a cross-sectional area with the first width, and two other channels of the plurality of channels may each have a cross-sectional area with the second width.

In some implementations, the at least one channel may have a cross-sectional area that varies such that the cross-sectional area has a first height at a first distance from the center axis along the pathway of the at least one channel and a second height smaller than the first height at a second distance from the center axis along the pathway of the at least one channel that is greater than the first distance.

In some implementations, the at least one channel may include a front surface that spans between a bottom surface of the at least one channel and an outer edge of the at least one channel, and the front surface may be a substantially planar surface.

In some implementations, the at least one channel may include a front surface that spans between a bottom surface of the at least one channel and an outer edge of the at least one channel, and the front surface may be a nonplanar surface.

In some implementations, all the channels of the plurality of channels may have the cross-sectional area that varies such that the cross-sectional of each channel has the first height at the first distance from the center axis along the pathway of the corresponding channel and the second height smaller than the first height at the second distance from the center axis along the pathway of the corresponding channel that is greater than the first distance.

In some implementations, a second channel may have the cross-sectional area that varies such that the cross-sectional area of the second channel has the first height at the first distance from the center axis along the pathway of the second channel and the second height smaller than the first height at the second distance from the center axis along the pathway of the second channel that is greater than the first distance, and two other channels may each have a cross-sectional area that remains substantially constant along the corresponding pathway of each channel.

In some implementations, the at least one channel may have a cross-sectional area that varies such that the cross-sectional area has a first width at a first distance from the center axis along the pathway of the at least one channel and a second width larger than the first width at a second distance from the center axis along the pathway of the at least one channel that is greater than the first distance.

In some implementations, all the channels of the plurality of channels may have a cross-sectional area that varies such that the cross-sectional area of each channel has the first width at the first distance from the center axis along the pathway of the corresponding channel and the second width larger than the first width at the second distance from the center axis along the pathway of the corresponding channel that is greater than the first distance.

In some implementations, a second channel may have the cross-sectional area that varies such that the cross-sectional area of the second channel has the first width at the first distance from the center axis along the pathway of the second channel and the second width larger than the first width at the second distance from the center axis along the pathway of the second channel that is greater than the first distance, and two other channels may each have a cross-sectional area that remains substantially constant along the corresponding pathway of each channel.

In some implementations, a method of cleaning a multi-station processing chamber may be provided. The multi-station processing chamber may have a plurality of processing stations within a chamber interior, a hub located in a center area of the chamber interior (the hub configured to be moveable along a vertical center axis of the hub relative to the chamber and having a first set of flow redirection features in a first radial region of a top surface of the hub and a second set of flow redirection features in a second radial region of the top surface of the hub which is concentric with the first radial region), and a cleaning chemistry inlet configured to direct a cleaning chemistry from a remote source into the chamber interior and onto the top surface of the hub. One of the first radial region and the second radial region may be encircled by the other of the first radial region and the second radial region, the flow redirection features in the first set of flow redirection features may each have a first cross-sectional profile in a corresponding plane that is coincident with, and parallel to, the vertical center axis, and the flow redirection features in the second set of flow redirection features each have a second cross-sectional profile in a corresponding plane that is coincident with, and parallel to, the vertical center axis. The method may include flowing, while the hub is at a first elevational position with respect to the cleaning chemistry inlet, the cleaning chemistry from the remote source through the cleaning chemistry inlet and onto the top surface of the hub, thereby causing the cleaning chemistry to impinge on the flow redirection features in the first set of flow redirection features and be directed along a first outward direction; moving the hub from the first elevational position to a second elevational position; and flowing, while the hub is at the second elevational position with respect to the cleaning chemistry inlet, the cleaning chemistry from the remote source through the cleaning chemistry inlet and onto the top surface of the hub, thereby causing the cleaning chemistry to impinge on the flow redirection features in the second set of flow redirection features and be directed along a second outward direction, in which the first outward direction and the second outward direction are different.

In some implementations, the cleaning chemistry inlet may have a plurality of flow outlets that are configured to direct the cleaning chemistry along a plurality of flow paths that are each at least partially at an oblique angle to an axis parallel to the vertical center axis.

In some implementations, the cleaning chemistry inlet may have a single flow outlet configured to direct the cleaning chemistry along the vertical center axis.

In some implementations, the first cross-sectional profiles may be configured to direct the cleaning chemistry flowed from the cleaning chemistry inlet in a direction that has a radially outward component relative to the vertical center axis and a component that is parallel to the vertical center axis and oriented towards the cleaning chemistry inlet.

In some implementations, the second cross-sectional profiles may be configured to direct the cleaning chemistry flowed from the cleaning chemistry inlet in a direction that has a radially outward component relative to the vertical center axis and, optionally, a component that is parallel to the vertical center axis and oriented away from the cleaning chemistry inlet.

In some implementations, the first radial region may encircle the second radial region, while in other implementations, the second radial region may encircle the first radial region.

In some implementations, a multi-station semiconductor processing system may be provided that includes a chamber having a plurality of processing stations within a chamber interior of the chamber; a hub located in a center area of the chamber interior, configured to be moveable along a vertical center axis of the hub relative to the chamber, and having a first set of flow redirection features in a first radial region of a top surface of the hub and a second set of flow redirection features in a second radial region of the top surface of the hub which is concentric with the first radial region; a cleaning chemistry inlet configured to direct a cleaning chemistry from a remote source into the chamber interior and onto the top surface of the hub; and a controller having at least one processor and at least one memory. One of the first radial region and the second radial region may be encircled by the other of the first radial region and the second radial region, the flow redirection features in the first set of flow redirection features may each have a first cross-sectional profile in a corresponding plane that is coincident with, and parallel to, the vertical center axis, the flow redirection features in the second set of flow redirection features may each have a second cross-sectional profile in a corresponding plane that is coincident with, and parallel to, the vertical center axis, and the at least one memory may store instructions which, when executed by the at least one processor, cause the at least one processor to: cause, while the hub is at a first elevational position with respect to the cleaning chemistry inlet, the cleaning chemistry to flow from the remote source through the cleaning chemistry inlet and onto the top surface of the hub, thereby causing the cleaning chemistry to impinge on the flow redirection features in the first set of flow redirection features and be directed along a first outward direction; cause the hub to move from the first elevational position to a second elevational position; and cause, while the hub is at the second elevational position with respect to the cleaning chemistry inlet, the cleaning chemistry to flow from the remote source through the cleaning chemistry inlet and onto the top surface of the hub, thereby causing the cleaning chemistry to impinge on the flow redirection features in the second set of flow redirection features and be directed along a second outward direction, in which the first outward direction and the second outward direction may be different.

In some implementations, the cleaning chemistry inlet may have a plurality of flow outlets that are configured to direct the cleaning chemistry along a plurality of flow paths that are each at least partially at an oblique angle to an axis parallel to the vertical center axis.

In some implementations, the cleaning chemistry inlet may have a single flow outlet configured to direct the cleaning chemistry along the vertical center axis.

In some implementations, the first cross-sectional profiles may be configured to direct the cleaning chemistry flowed from the cleaning chemistry inlet in a direction that has a radially outward component relative to the vertical center axis and a component that is parallel to the vertical center axis and oriented towards the cleaning chemistry inlet.

In some implementations, the second cross-sectional profiles may be configured to direct the cleaning chemistry flowed from the cleaning chemistry inlet in a direction that has a radially outward component relative to the vertical center axis and, optionally, a component that is parallel to the vertical center axis and oriented away from the cleaning chemistry inlet.

In some implementations, the first radial region may encircle the second radial region, while in other implementations, the second radial region may encircle the first radial region.

In some implementations, a multi-station semiconductor processing system may be provided that includes a chamber having a plurality of processing stations within a chamber interior of the chamber; a structure located in the chamber interior and configured to be moveable along a vertical center axis; a cleaning chemistry inlet configured to direct a cleaning chemistry from a remote source into the chamber interior and onto the structure; and a controller having at least one processor and at least one memory. The at least one memory may store instructions which, when executed by the at least one processor, cause the at least one processor to: cause, while the structure is at a first elevational position with respect to the cleaning chemistry inlet, the cleaning chemistry to flow from the remote source through the cleaning chemistry inlet and onto the structure, thereby causing the cleaning chemistry to be directed along a first outward direction; cause the structure to move from the first elevational position to a second elevational position; and cause, while the structure is at the second elevational position with respect to the cleaning chemistry inlet, the cleaning chemistry to flow from the remote source through the cleaning chemistry inlet and onto the structure, thereby causing the cleaning chemistry to be directed along a second outward direction, in which the first outward direction and the second outward direction are different.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 7 depicts an example technique in accordance with disclosed embodiments.

FIG. 8 depicts a second example technique in accordance with disclosed embodiments.

FIGS. 11-1 and 11-2 depict diagrams of portions of another example multi-station semiconductor processing chamber.

FIGS. 12-1 through 12-5 depict various views of a hub with different flow redirection features in different azimuthal positions.

DETAILED DESCRIPTION

Figure 1A:
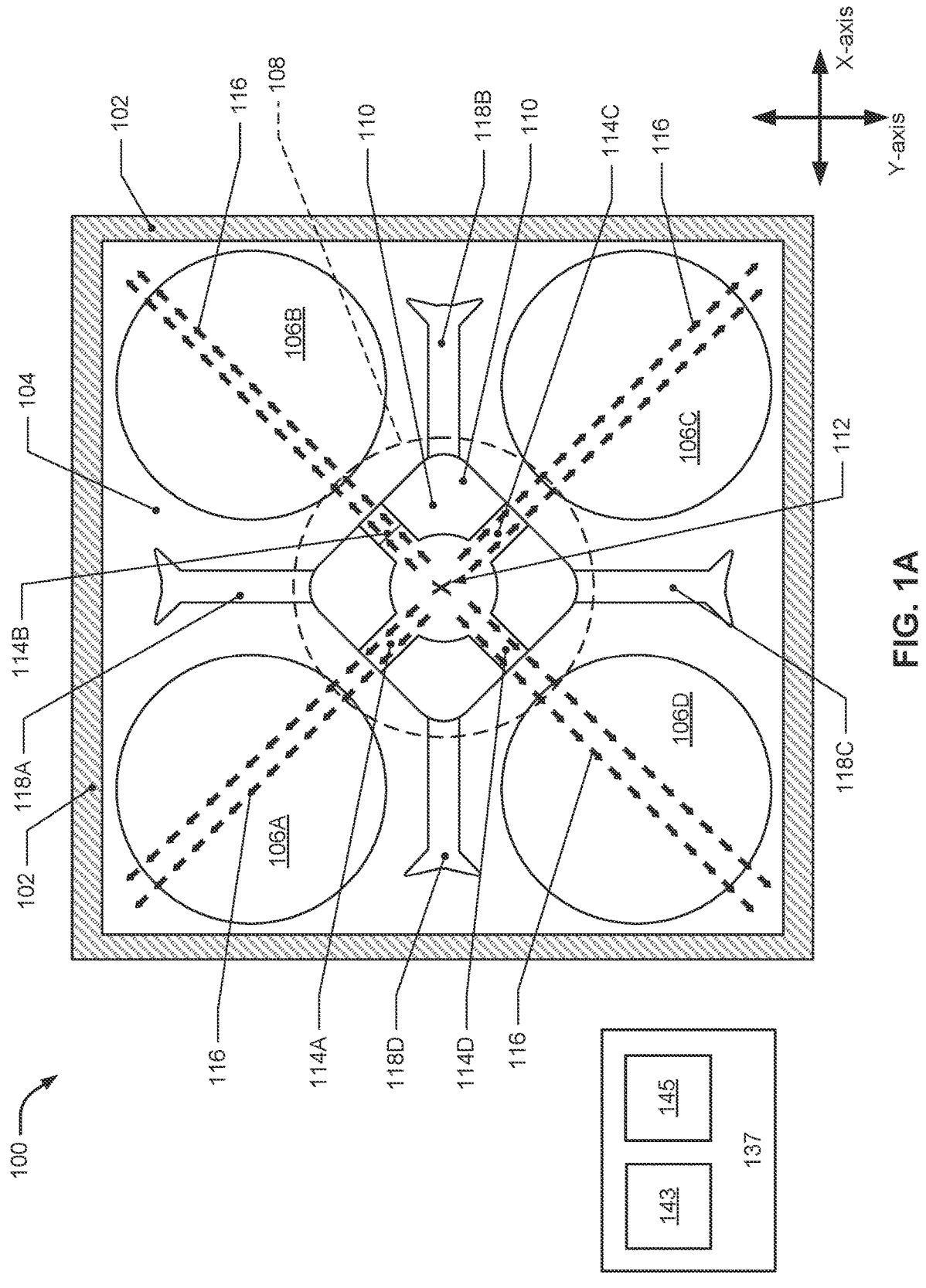
FIG. 1A depicts a top view of a multi-station processing chamber according to disclosed embodiments.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Definitions

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the embodiments are implemented for use with such a wafer. However, the description is not so limited. The work piece may be of various shapes, sizes, and materials. In addition to semiconductor wafers, other work pieces that may take advantage of these embodiments include various articles such as printed circuit boards, magnetic recording media, magnetic recording sensors, mirrors, optical elements, micro-mechanical devices and the like.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

Introduction and Context

Multi-station semiconductor processing tools ("multi-station tools") have two or more processing stations within a single processing chamber which can lead to numerous advantages, such as increasing throughput by enabling parallel processing of multiple wafers while at the same time utilizing common processing equipment between the various stations. For instance, in a chamber with four processing stations, four substrates placed in the four separate stations may be processed at the same time.

Cleaning processes in processing stations and chambers are important to maintaining the life expectancy of the equipment, decreasing operation cost, preventing particle contamination on wafer processing, and maintaining high throughput of wafers. Shorter clean times and more efficient cleaning methods are critical to various stages of processing wafers in integrated circuit fabrication. Unwanted residue and other deposited material can accumulate on the processing chamber's walls, top surface, bottom surfaces, support ribs, as well as various surfaces of each processing station, such as the support structure therewithin, e.g., a pedestal or electrostatic chuck, a showerhead, and above the showerhead. The configuration of some of these features can make them difficult to clean, such as a combination of variable geometry such as curved and planar surfaces, or inaccessibility due to the features being covered by other elements or not within a field of the cleaning gas flows.

Some new and emerging processing operations also may create unwanted contaminants and residue in areas of the processing chamber where such unwanted material was not previously deposited. Some existing processing chamber processes and structures are unable to clean these areas with the newly deposited materials. In some instances, this inability may be further compounded by existing hardware blocking or covering access to these areas.

The present inventors discovered that the multi-station processing chambers provided herein could be efficiently and effectively cleaned by flowing cleaning chemistry into a multi-station chamber through a cleaning chemistry inlet and onto a cleaning gas distribution hub (hereinafter referred to as the "hub") having a plurality of channels that direct the cleaning chemistry into various regions of the processing chamber, and rotating the hub to two or more angular positions during the cleaning process. By positioning the hub in multiple angular positions during cleaning operations, the cleaning chemistry can be directed to different areas of the processing chamber and clean those areas. The present inventors further discovered that various configurations of the geometry of the channels of the hub can improve the cleaning of the processing chamber. As used herein "cleaning chemistry" includes a cleaning fluid, a cleaning gas, and/or a cleaning plasma such as a fluorine plasma; these terms may be used synonymously herein.

Apparatuses

Aspects of this disclosure pertain to techniques and apparatuses that flow a cleaning chemistry onto a hub having a plurality of channels configured to direct the cleaning chemistry into the processing chamber, and that rotate the hub to two or more angular positions during cleaning operations. In some implementations, the hub may be positioned in a relatively central location of the processing chamber and underneath a cleaning chemistry inlet, e.g., a plasma inlet, such that the cleaning chemistry can flow in a downwards direction (e.g., a downwards vector that has only a vertical component, or at angles or vectors with both horizontal and vertical directional components) onto the hub. Each channel in the hub has side surfaces and a bottom surface that are configured to receive the cleaning chemistry and direct it into the processing chamber and towards various features within the processing chamber.

FIG. 1A depicts a top view of a multi-station processing chamber according to disclosed embodiments. The multi-station processing chamber 100 (which may also be referred to herein as the "chamber" or the "processing chamber") here includes chamber side walls 102 that at least partially define a chamber interior 104, as well as four processing stations 106A-106D positioned within the chamber interior 104. The multi-station processing chamber 100 has an area at the center of the chamber, referred to as a center region 108 and indicated by the dashed circle. A cleaning gas distribution hub 110 (hereinafter referred to as the "hub") that includes four channels 114A-D is positioned in this center region 108 of the multi-station processing chamber 100. As described in more detail below, a cleaning chemistry inlet of the processing chamber 100 is configured to flow cleaning chemistry onto the hub 110, and the hub 110 is configured to direct that cleaning chemistry flow into the processing chamber. FIG. 1A also depicts illustrative lateral flows of the cleaning chemistry in the X-Y plane, represented by arrows 116, from the channels 114A-D into the processing chamber which, as depicted, includes the four stations 106A-D.

The multi-station processing chamber 100 provided herein is configured to rotate the hub about a center axis 112 to various angular positions and thereby direct the cleaning chemistry into multiple areas of the processing chamber. In some implementations, the hub may be positioned on, or a part of, a wafer transfer mechanism such as a carousel, wafer indexer, or other wafer transportation device configured to move, or simultaneously move, a plurality of wafers between the plurality of processing stations 106A-D, such as simultaneously rotating them about the center axis 112. In some instances, like shown in FIG. 1A, the hub may be positioned on, or a part of, a wafer indexer. The wafer indexer may have a plurality of robotic arms, end effectors, or other structures configured to hold and position wafers in the processing chamber. In FIG. 1A, the wafer indexer of the processing chamber 100 includes four arms 118A-D that are each configured to hold and position one wafer. This wafer indexer is configured to rotate about the center axis 112, which includes rotating the arms 118A-D and the hub 110 at the same time.

In some implementations, the wafer indexer may have the same number of arms as processing chambers, and the hub may also have the same number of channels as processing chambers. As further illustrated in FIG. 1A, in some embodiments, the channels 114A-D extend outwards in a radial direction from the center axis 112 and are arranged in a radial or circular pattern around the center axis 112. The arms 118A-D may also be arranged in a radial or circular pattern around the center axis 112, in some embodiments. Each channel may, in some embodiments, be positioned in between two arms of the wafer indexer. For example, in FIG. 1A, channel 114A is in-between arms 118A and 118D, channel 114B is in-between arms 118A and 118B, channel 114C is in-between arms 118B and 118C, and channel 114D is in-between arms 118C and 118D.

Figure 1B:
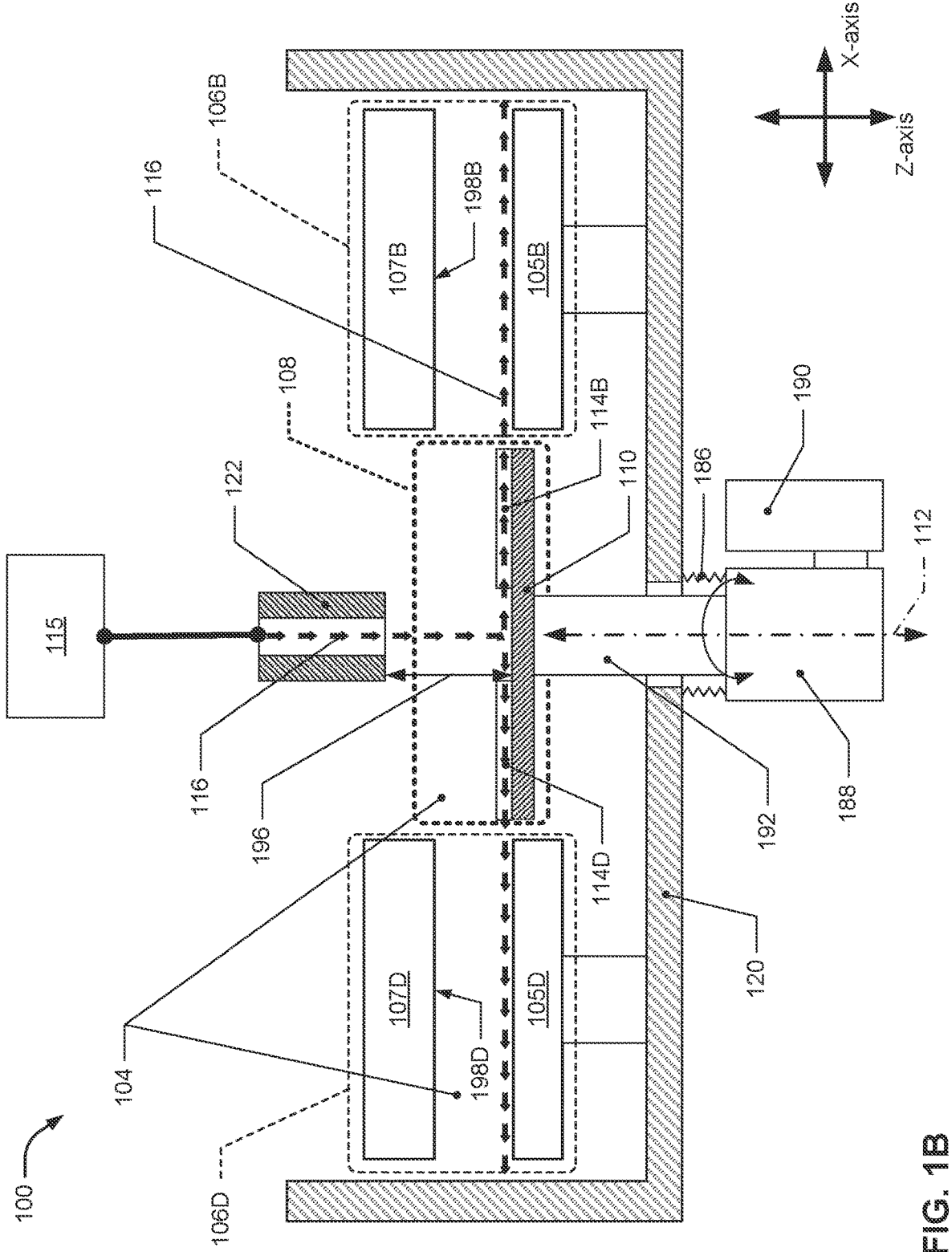
FIG. 1B depicts a cross-sectional side view of the processing chamber of FIG. 1A taken along a corner-to-corner diagonal of the chamber.

FIG. 1B depicts a cross-sectional side view of the processing chamber of FIG. 1A taken along a corner-to-corner diagonal of the chamber. The side walls 102 and bottom 120 of the multi-station processing chamber 100 are shown and for clarity, the top portion of the multi-station processing chamber 100 is not shown. Two processing stations are illustrated, which may be considered the stations across from each other with respect to the center of the multi-station processing chamber 100, such as processing stations 106B and 106D as shown, or processing stations 106A and 106C. Each processing station 106B and 106D includes a pedestal 105B and 105D, respectively, and a showerhead 107B and 107D, respectively. Each showerhead 107B and 107D has a face 198B and 198D that faces the pedestal 105B and 105D. The hub 110 is positioned in the chamber interior 104 and in the center region 108 of the multi-station processing chamber 100, and underneath the cleaning chemistry inlet 122 by a non-zero offset distance 196. The hub 110 is connected with a hub positioning mechanism, e.g., a rotational drive 188, by a shaft 192 that passes through an aperture in the bottom 120 of the chamber 100. The rotational drive 188, e.g., one or more electrical motors, may be actuated to cause the hub 110, and thus the indexer, to rotate about the center axis 112. The rotational drive 188 may, in turn, be mounted to a vertical lift mechanism 190 that may be actuated to cause the rotational drive 188, and thus the hub 110 and the indexer that includes the hub 110, to move between two or more elevational positions relative to the chamber 100. A bellows seal 186 may be provided between the rotational drive 188 and the chamber 100 in order to provide a flexible seal interface that may accommodate the vertical movement of the rotational drive 188 relative to the chamber 100.

In FIG. 1B, the cleaning chemistry inlet 122 is seen fluidically connected to a cleaning chemistry source 115, e.g., a remote plasma source. The cleaning chemistry is configured to flow from the source 115, through the cleaning chemistry inlet 122, into the center area 108 of the chamber interior 104, and onto hub 110. The cleaning chemistry flow, such as a plasma flow, is again represented by arrows 116. As illustrated in FIGS. 1A and 1B, the cleaning chemistry flow 116 flows from the center area outwards into the chamber interior 104 as directed by the channels 114A-D in the hub 110. Depending on the angular positioning in the hub 110, the configuration of the channels, or both, the cleaning chemistry is flowed into and onto various regions of the chamber interior 104 to clean such areas.

Figure 2A:
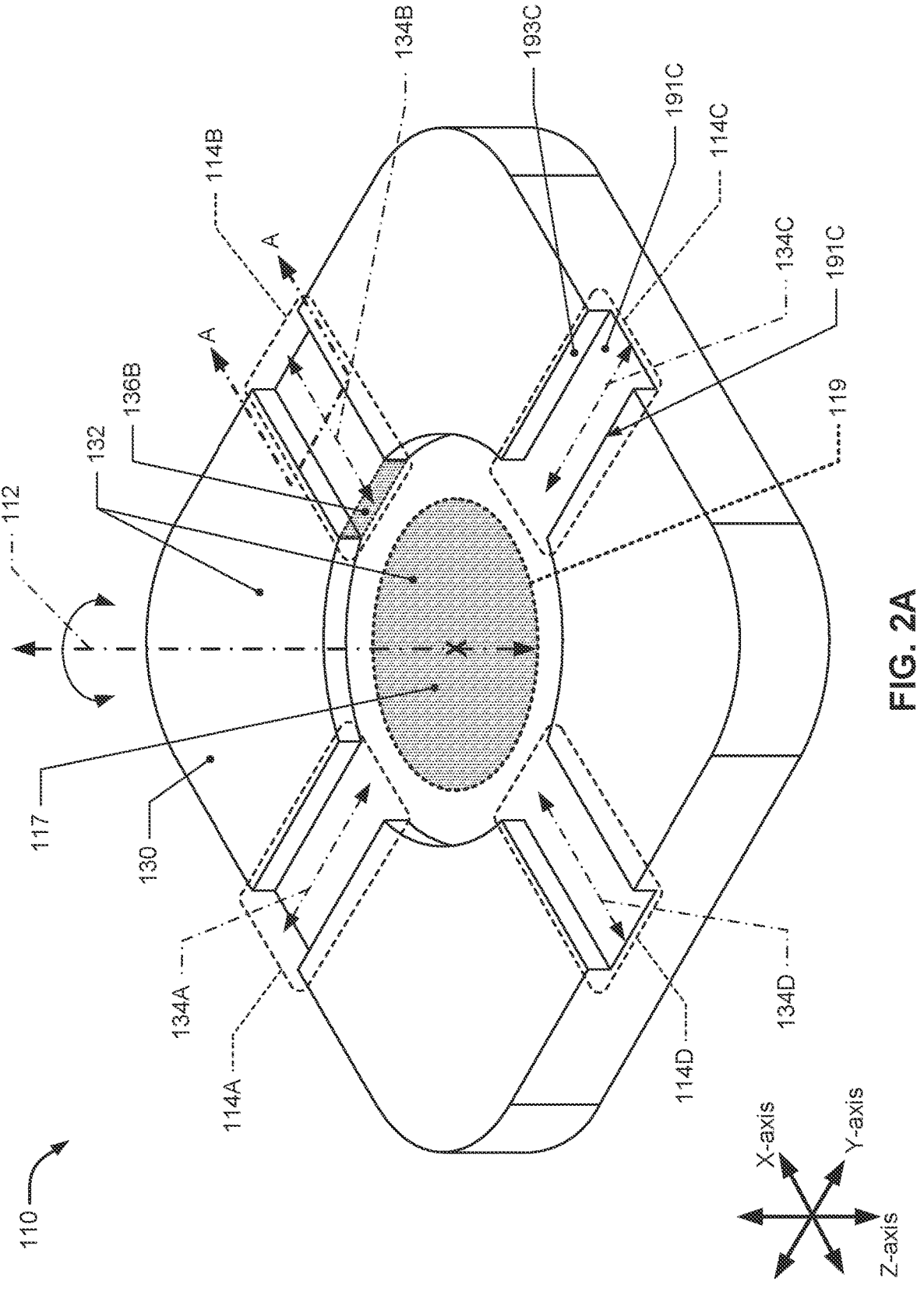
FIG. 2A depicts an off-angle view of a hub in accordance with disclosed embodiments.

Additional details and configurations of the hub of FIGS. 1A and 1B will now be discussed; other configurations are discussed below. FIG. 2A depicts an off-angle view of a hub in accordance with disclosed embodiments. The hub 110 here may be the same hub depicted in FIGS. 1A and 1B; the hub 110 includes a body 130 with a top surface 132 and an underside surface (not visible in this Figure) on the opposite side of the body 130, and a center axis 112 extending through the body 130. In some implementations, as shown here, the top surface 132 may be perpendicular, or substantially perpendicular (e.g., within 10% of perpendicular), to the center axis 112. As illustrated, the body 130 may have a square or rectangular shape, and may have recessed features in the top surface that includes a hub central area 117 and the four channels 114A-D. The hub central area 117 may have a circular shape, as shown, and may be at least one of the areas where the cleaning chemistry initially contacts and flows onto the hub 110 from the plasm inlet (shown in FIG. 1A). One example region where the cleaning chemistry may contact the hub 110 is represented by a circle 119, although it is to be understood that his region may not be exactly circular in shape; rather this area is a representative illustration. In some instances, the cleaning chemistry may contact other portions of the hub and/or features of the chamber interior. Each of the channels 114A-D in the top surface 132 are encompassed with in a dashed rectangle. In some implementations, the number of channels in the hub may match the number of processing stations in the processing chamber. In some other implementations, the hub may have more or less channels than processing stations.

The channels of the hub may be configured in various manners. For example, in some implementations, each channel may have a cross-sectional area that is generally rectangular, as shown in FIG. 2A. Each channel extends radially outwards in a direction perpendicular to the hub's center axis 112. In some embodiments, each channel may be considered to extend along an individual pathway and each channel's cross-sectional area is perpendicular to and swept along this pathway. For instance, channel 114B in FIG. 2A extends along pathway 134B, which extends radially outwards from the center axis 112, and has a cross-sectional area 136B shown with shading and a dotted exterior that is swept along this pathway 134B. The other channels 114A, 114C, and 114D also extend radially outwards from the center axis 112 in a direction perpendicular to the center axis 112 and also along respective pathways with rectangular cross-sectional areas that are each swept along the channel's corresponding, respective pathway. In some implementations, each of these channels may be considered to be defined by at least a bottom surface and at least two side surfaces that intersect with the bottom surface. In FIG. 2A, these features are illustrated on channel 114C, with the bottom surface 191C and the two side surfaces 193C and 195C, although side surface 195C is not visible in this Figure.

Figures 2B, 2C:
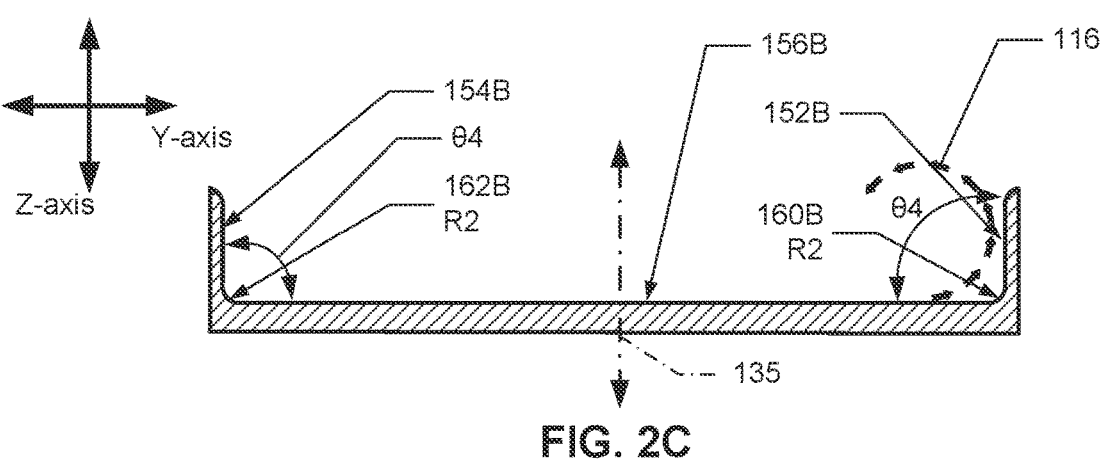
FIG. 2B depicts a top view of the hub of FIG. 2A.
FIG. 2C depicts a cross-sectional slice of one channel of the hub FIG. 2A.

FIG. 2B depicts a top view of the hub of FIG. 2A. Here, the center axis 112 is perpendicular to the plane of the Figure. The four recesses 114A-D are arranged around the center axis 112, such as equally, or substantially equally (e.g., within 10% of equal), spaced around the center axis 112. This arrangement may also be considered the recesses 114A-D being arranged in a radial pattern around the center axis 112. Each channel is also fluidically connected to the hub central area 117. Cleaning chemistry that flows onto the hub 110, such as onto the hub central area 117, may be caused to flow from the hub central area 117 into the plurality of channels and radially outwards into the interior volume of the processing chamber. For example, as illustrated by arrows 116, the cleaning chemistry that flows into the hub central area 117, as represented by exemplary circle 119, is caused to flow radially outwards and through the channels 114A-D into the chamber interior. In some instances, the hub may be considered to direct this plasma flow into the chamber interior.

Figures 3A, 3B:
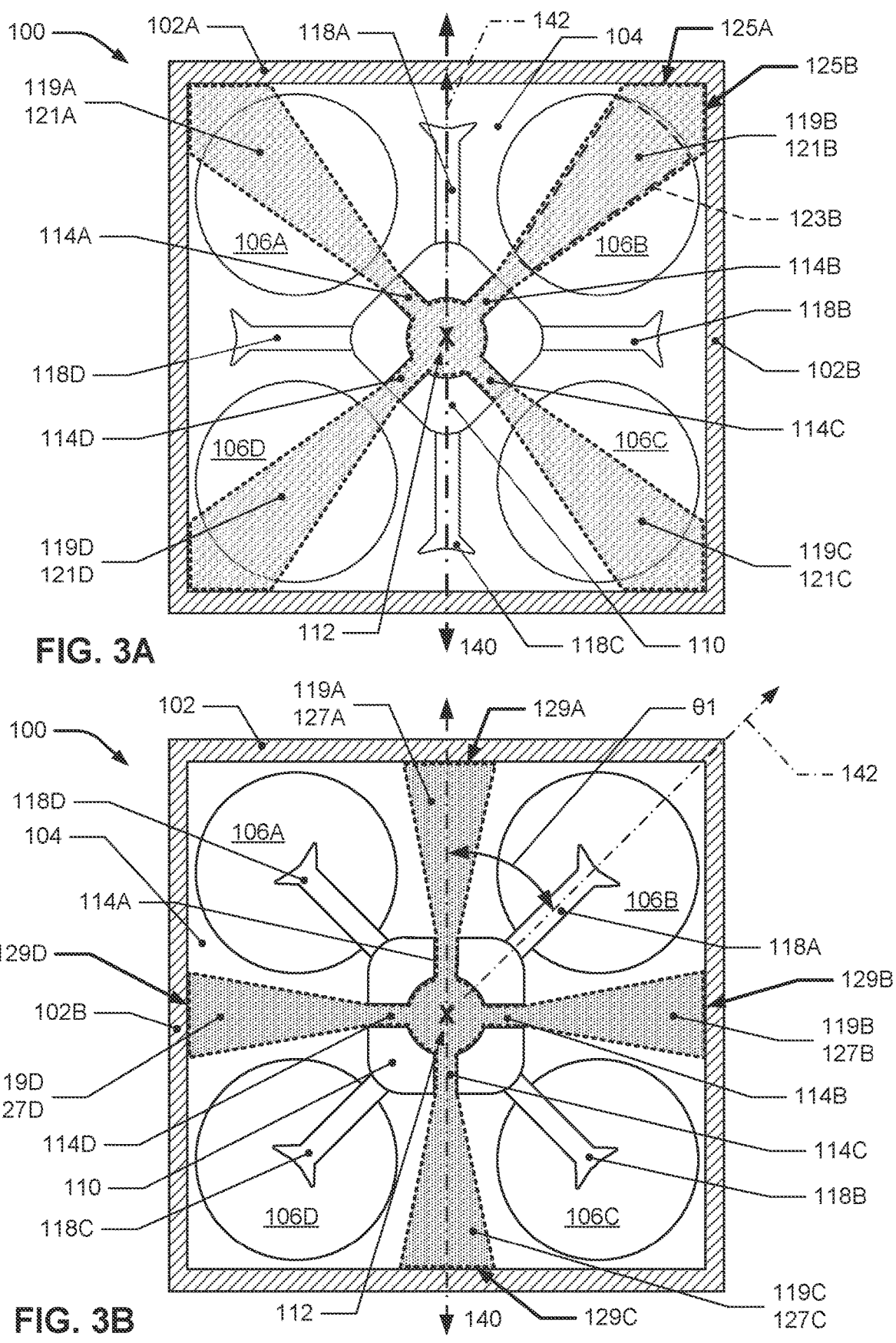
FIG. 3A depicts the top view of the multi-station processing chamber of FIG. 1A with the hub at a first angular position.
FIG. 3B depicts the top view of the multi-station processing chamber of FIG. 1A with the hub at a second angular position.

Rotating the hub during cleaning operations according to some disclosed embodiments will now be discussed. As provided above, the multi-station processing chamber 100 is configured to rotate the hub 110 about the center axis 112. In FIGS. 2A and 2B, this rotatability is indicated by the double-sided curved arrow. By rotating the hub about the center axis to multiple angular positions during cleaning operations, multiple and different areas of the chamber interior may be cleaned. FIGS. 3A-3D illustrate exemplary angular positions for cleaning multiple areas of the chamber interior. FIG. 3A depicts the top view of the multi-station processing chamber of FIG. 1A with the hub at a first angular position. In some embodiments, as shown in FIG. 3A, the angular position of the hub may be measured with respect to a reference point or axis of the chamber 100, such as a reference axis 140 or reference plane that intersects with the center axis 112 and is perpendicular to the center axis 112. In this Figure, the reference axis 140 extends through and is perpendicular to the center axis 112, and may also be considered perpendicular to a chamber sidewall 102A and/or parallel to another chamber sidewall 102B. As provided herein, the angular position of the hub 110 is measured with respect to this reference axis 140. A point or other referential axis on the hub 110 may be used as the hub's reference point with respect to the reference axis 140 of the chamber. Here, the hub includes a hub reference axis 142 that extends through one of the arms, such as arm 118A. As depicted in FIG. 3A, the hub reference axis 142 is collinear with the reference axis 140. It will be understood, that the reference axis to which the hub's angular position is measured may be selected at other orientations, such as perpendicular to the depicted reference axis 140, or at any other angle. In some implementations, the angular positioning of the hub may be considered relative to itself, such as rotating a particular amount relative from a start position to an end position.

In FIG. 3A, the hub 110 is positioned at a first angular position that may be considered at 0 degrees with respect to the reference axis 140. As provided above, the hub reference axis 142 is collinear with the reference axis 140. With the hub at this first angular position, the channels of the hub 110 direct the flow of the cleaning chemistry into the chamber interior 104 and onto various regions in the chamber interior 104. Representative cleaning chemistry flows are shown with shading having dotted boundaries and labeled 119A-D; each representative chemistry flow is associated with a corresponding channel of the hub 114A-D, respectively. These cleaning chemistry flows 119A-D are directed onto regions of the chamber interior 104 and these regions correspond with and are encompassed by the areas of these flows 119A-D. Accordingly, the regions are labeled 121A-D respectively and are the same areas as the cleaning chemistry flows 119A-D, respectively, shown in FIG. 3A. The regions 121A-D of the chamber 100 onto which the cleaning chemistry is flowed and cleaned includes a portion of each substrate support at each station and portions of the chamber sidewalls; these portions include surfaces of the features in the processing chamber interior 104. For example, cleaning chemistry 119B flows onto a portion 123B of the substrate support structure in station 106B, outlined with a dashed line, and onto portions 125A and 125B of two sidewalls 102A and 102B.

In order to clean multiple portions of the chamber interior, the hub is rotated to one or more other angular positions. FIG. 3B depicts the top view of the multi-station processing chamber of FIG. 1A with the hub at a second angular position. In FIG. 3B, the hub 110 has been rotated by a first angle θ1 to a second angular position with respect to the reference axis 140. As shown, the hub reference axis 142 of the hub 110 has been rotated by the first angle θ1 which may be, in some embodiments, greater than 0 degrees and less than 90 degrees, such as greater than 0 and less than or equal to about 60 degrees, greater than 0 and less than or equal to about 45 degrees, greater than 0 and less than or equal to about 30 degrees, greater than 0 and less than or equal to about 15 degrees, between about 60 degrees and less than 90 degrees, for example. In FIG. 3B, the hub has been rotated by about 45 degrees. This rotation of the hub 110 causes the channels 114A-D of the hub 110 to direct the cleaning chemistry flows 119A-D to different regions of the chamber 100 than in FIG. 3A. Here in FIG. 3B, this positioning of the hub 110 causes the cleaning chemistry flows 119A-D to flow onto second regions 127A-D of the chamber interior 104. These second regions 127A-D include surfaces of the chamber interior that are in-between the processing stations 106A-D and sidewall areas 129A-D that are also in-between the stations 106A-D. In some instances, the chamber surfaces with the second regions 127A-D include support ribs or other support structures and features of the processing chamber 100. In some instances, the second regions may partially overlap with the first regions or may be separate than the first regions.

Rotating and positioning the hub 110 to the position in FIG. 3B provides numerous advantages. For instance, multiple areas of the chamber interior 104 can be cleaned. Additionally, when in the position of FIG. 3A, the arms 118A-D of the wafer indexer may cover features, surfaces, and structures of the processing chamber which prevents or impedes the cleaning of these covered items. In some instances, the arms 118A-D may also prevent or impede cleaning chemistry from reaching the sidewalls 129A-D of the chamber 100 that are in-between the stations 106A-D. By rotating and positioning the hub 110 to the position in FIG. 3B, the arms 118A-D are moved and the features, surfaces, and/or structures previously covered by the arms 118A-D are uncovered and accessible to the cleaning chemistry flows. Similarly, the cleaning chemistry is also able to be flowed directly onto various areas and regions of the processing chamber that were not accessible or reached in the position of FIG. 3A, such as the sidewall portions 129A-D.

Figures 3C, 3D:
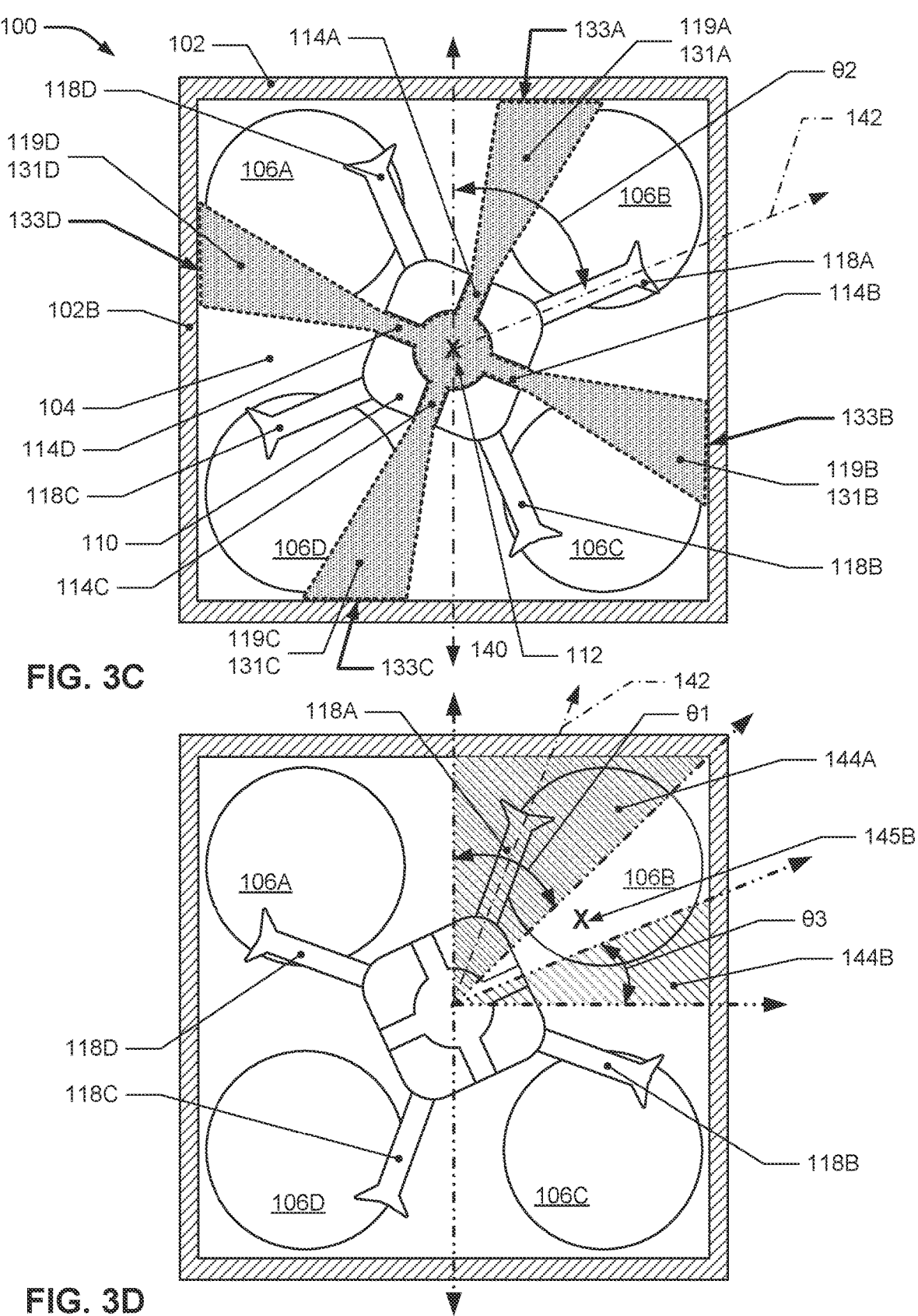
FIG. 3C depicts the top view of the multi-station processing chamber of FIG. 1A with the hub at a third angular position.
FIG. 3D depicts the top view of the multi-station processing chamber of FIG. 1A with the hub and exemplary rotational sectors.

The hub may be rotated by other angles and angular positions which causes the hub to direct cleaning chemistry onto other regions of the processing chamber. For example, FIG. 3C depicts the top view of the multi-station processing chamber of FIG. 1A with the hub at a third angular position. Here in FIG. 3C, the hub 110 has been rotated by a second angle θ2 to a third angular position with respect to the reference axis 140 as referenced to the hub reference axis 142 extending through arm 118A. In some embodiments, the second angle may be greater than 0 degrees and less than 90 degrees, such as greater than 0 and less than or equal to about 60 degrees, greater than 0 and less than or equal to about 45 degrees, greater than 0 and less than or equal to about 30 degrees, greater than 0 and less than or equal to about 15 degrees, between about 60 degrees and less than 90 degrees, for example. In FIG. 3B, the hub has been rotated by about 60 degrees from the reference axis 140. The hub 110 may be rotated into the third angular position from the first angular position shown in FIG. 3A, from the second angular position shown in FIG. 3B, or from any other angular position.

This rotation of the hub 110 causes the channels 114A-D of the hub 110 to direct the cleaning chemistry flows 119A-D to different regions of the chamber 100 than in FIGS. 3A and 3B. Here in FIG. 3C, this positioning of the hub 110 causes the cleaning chemistry flows 119A-D to flow onto third regions 131A-D of the chamber interior 104. These third regions 131A-D include surfaces of the chamber interior that are in-between the processing stations 106A-D and sidewall areas 133A-D that are also in-between the stations 106A-D as well as some of the processing station surfaces. Similar to above, rotating and positioning the hub 110 to the position in FIG. 3C provides numerous advantages, such as enabling the cleaning chemistry is flow onto various areas and regions of the processing chamber that were not accessible or reached in the positions of FIGS. 3A and/or 3C.

In some embodiments, the rotatability of the hub may be impeded by various structures in the chamber. For example, some substrate support structures may have features that prevent the hub from fully rotating between 0 and 90 degrees. These features may include edge rings or lift pins, for example. As described in more detail below, in some implementations, the substrate support structure of each station and hub may be lowered into a cleaning position and some features of the processing chamber 100 may not be able to be lowered as low as the hub or substrate support structure, and these features may therefor protrude vertically and impede the hub's rotation or positioning at or around these lowered positions.

For example, when the substrate supports of stations 106A-D and hub 110 in FIGS. 3A-C are lowered into cleaning positions, one or more structures may protrude from the substrate supports, such as a lift pin, which impedes rotational movement of the arms 118A-D and hub 110. FIG. 3D depicts the top view of the multi-station processing chamber of FIG. 1A with the hub and exemplary rotational sectors. Here, an obstruction 145B is seen in the substrate support structure of station 106B which limits some of the rotation of the hub 110. Because of this obstruction 145B, the hub 110 is able to rotate with a first sector 144A having the first angle θ1 and a second sector 144B having a third angle θ3. In some implementations, even with these features that impede such rotation, the hub and/or substrate support structures may be raised while the hub is rotating in order to provide adequate clearance to the hub to enable the hub's rotation between 0 and 90 degrees, for instance.

In some implementations, the hub is rotatable by a full 360 degrees around the center axis and may be positioned at any angular rotation within a full circle. In some instances, as illustrated in FIGS. 3A-3C, the hub may have symmetric features about the center axis and it may be advantageous to limit the hub's rotation between 0 and 90 degrees because rotating past 90 degrees may repeat the same configuration as at 0 degrees. For example, the hub 110 in FIGS. 1-3C may have identical channels symmetrically arranged around the center axis. Positioning this hub 110 at the angular position of 0 degrees in FIG. 3A may be the same as positioning this hub 110 at 90, 180, or 270 degrees. In some other embodiments, as provided below, the hub may channels that are not identical to each other and it may be advantageous to rotate the hub more than 90 degrees in order for the different channels to each rotate within the same 90 degree sector of the processing chamber 100, including rotating the hub so that at least two different channels, e.g., channels 114A and 114B are each positioned withing the first and second sectors of FIG. 3D.

In some embodiments, the vertical height of the hub is adjusted during cleaning operations. In some such embodiments, the cleaning chemistry is flowed onto the hub while the hub is at a first vertical distance with respect to the top or bottom of the chamber and the hub is rotated between angular positions at a second position that is closer to the top of the chamber, or higher from the bottom of the chamber. Accordingly, in some implementations, the hub may be positioned at the first vertical distance so it can be actively cooled while the cleaning chemistry flows onto the hub. For example, some cleaning chemistries, like a fluorine plasma, are at temperatures above 700° C. which may be higher than the melting point of the material or materials that make up the hub, such as an aluminum or aluminum alloy. Actively cooling the hub while the cleaning chemistry is flowed onto the hub prevents unwanted damage to the hub and allows the use of cleaning chemistries at temperatures higher than melting or damage points of the hub materials.

The hub may be actively cooled during these cleaning operations in various ways, such as lowering the hub onto a heat sink in the chamber, such as structural elements of the chamber, and/or flowing a heat transfer fluid, such as a helium gas, within one or more internal cavities of the hub. In some such instances, lowering the hub so that it can be actively cooled may prevent it from being rotated at that vertical position. For instance, the hub may be in direct physical contact with the heat sink structures at the lower vertical position and rotating the hub when it is in contact with these structures may undesirably damage the wafer transfer mechanism, hub, chamber, and/or create particle contaminants. Because of this, the hub may be raised to a different vertical position before it is rotated, and then the hub is lowered after the rotating and before the cleaning chemistry is flowed onto the hub so that the hub can be actively cooled.

Figure 4A:
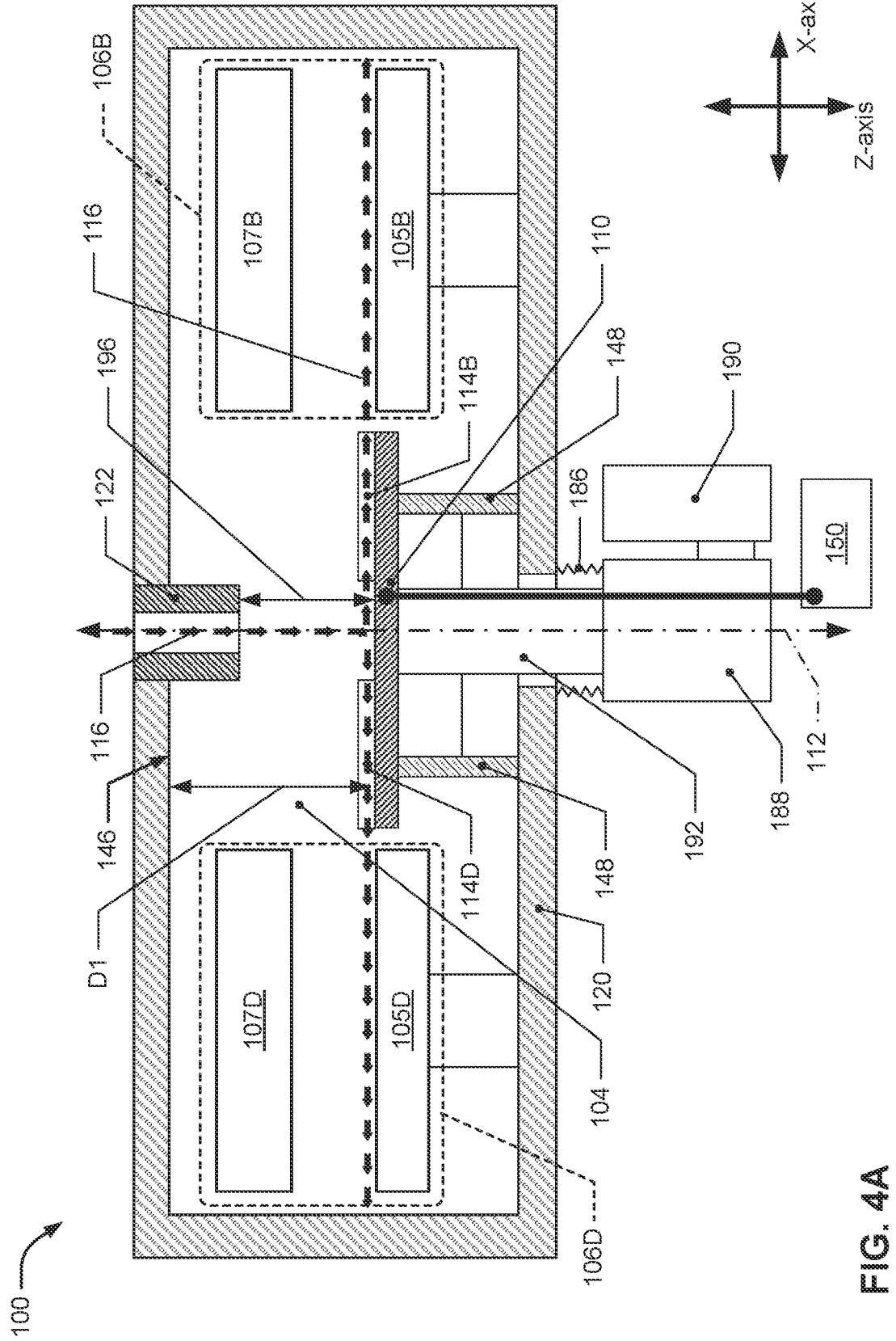
FIG. 4A depicts a cross-sectional side view of the multi-station processing chamber of FIG. 1B with the hub at a first vertical position.

FIG. 4A depicts a cross-sectional side view of the multi-station processing chamber of FIG. 1B with the hub at a first vertical position. Here, the vertical position D1 of the hub 110 may be measured between a top surface 146 of the chamber 100 and various features of the hub 110, such as the hub's top surface 132, one of the channels, or another reference surface of the hub 110; the vertical position D1 may also be measured in a direction parallel to the center axis 112 which may be parallel to the Z-axis. In this position, the hub is also thermally connected to, e.g., physically contacting, a heat sink structure 148 such as a structural element of the chamber or chamber interior and fluidically connected to a cooling fluid source 150. In this position, the hub 110 can be actively cooled and the cleaning chemistry 116 can be flowed through the cleaning chemistry inlet 122, onto the hub 110, and directed by the hub 110 into multiple regions of the chamber interior 104.

Figure 4B:
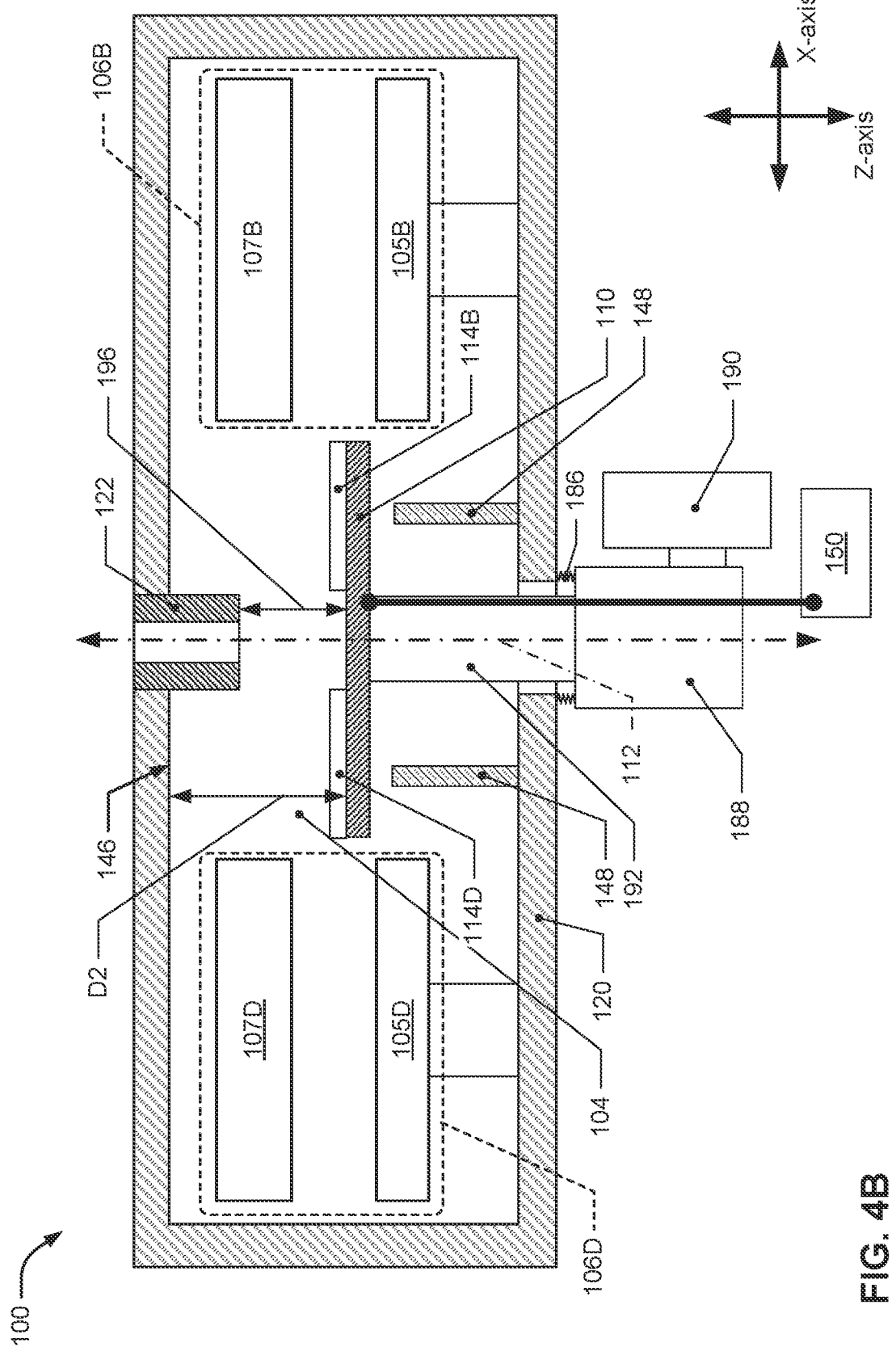
FIG. 4B depicts the cross-sectional side view of the multi-station processing chamber of FIG. 4A with the hub at a second vertical position.

In order to rotate the hub 110, the processing chamber 100 is configured to raise the hub 110, including raising it to a second vertical position D2. FIG. 4B depicts the cross-sectional side view of the multi-station processing chamber of FIG. 4A with the hub at a second vertical position. Here, the vertical position D2 of the hub 110 may be measured between a top surface 146 of the chamber 100 and a reference feature of the hub 110, such as the hub top surface 132, one of the channels, or another reference surface of the hub 110; the vertical position D2 may also be measured in a direction parallel to the center axis 112 or Z-axis. In this position, the hub is not thermally connected to, e.g., not physically contacting, the heat sink structure 148. In this position, the hub 110 is closer to the top surface 146 of the chamber 100 and farther from the bottom 120 of the chamber 100, and the hub can be advantageously rotated about the center axis 112. During this rotation, in some embodiments, the cleaning chemistry 116 is not flowed onto the hub while it is in this vertical position for rotation. After the hub 110 has been rotated while at this vertical position D2 to the desired angular position, the hub 110 may be lowered to the first vertical position D1 as shown in FIG. 4A and the cleaning chemistry may be flowed onto the hub 110 while the hub 110 is actively cooled.

It will be understood that in implementations in which the hub 110 is actively cooled using an elevation-independent cooling mechanism, e.g., by circulating a coolant through channels internal to the hub 110, the hub 110 may be rotated during the flow of cleaning chemistry. Thus, for example, the hub 110 may be rotationally repositioned during the flow of cleaning chemistry, causing the flow of the cleaning chemistry to "scan" through various rotational positions within the chamber interior 104. This may allow systems with such active cooling features to continuously change the azimuthal directions along which the cleaning chemistry is directed, thereby allowing the cleaning chemistry to be "swept" sector-shaped zones of the chamber interior in a smooth manner, as opposed to performing multiple, separate cleaning chemistry delivery operations at different, discrete angular positions of the hub 110. This may help smooth out the effects of the cleaning chemistry flow into the chamber interior 104. It will also be understood that such rotation of the hub during cleaning chemistry flow may also be performed with hubs 110 that lack such internal cooling passages. For example, a hub that has no active cooling features may be rotated during delivery of the cleaning chemistry for at least some duration of time before the heat provided to the hub by the cleaning chemistry flow reaches levels that may damage the hub or other nearby equipment. Thus, the technique discussed above is not limited to only hubs that are actively cooled using cooling passages.

In some embodiments, the flow conditions of the cleaning chemistry, such as the plasma, may be adjusted. This includes one or more of the flow rate, plasma power, plasma frequency, pressure, partial pressure, and/or flow time. Adjusting one or more of these flow conditions may adjust the nature of the cleaning performed by the cleaning chemistry, such as its ability to remove materials and reach other locations. For example, increasing the flow rate may cause the cleaning chemistry to reach farther into the chamber interior and spread to additional areas.

Alternative or additional configurations of the hub will now be discussed. As provided above, some embodiments of the hub include four channels that each extend along a radial pathway and have a constant cross-sectional area along their respective pathway. In some instances, these cross-sectional areas are rectangular, as shown above in FIG. 2A. In some embodiments, each channel may be defined by a bottom surface and sidewalls that intersect with the bottom surface. The intersections, or the internal corners, of the sidewalls and the bottom surface be rounded with a radius or chamfered. The sidewalls may also be oriented with respect to the bottom surface at various angles, such as acute, obtuse, or perpendicular.

FIG. 2C depicts a cross-sectional slice of one channel of the hub of FIG. 2A. Here, the cross-sectional slice is taken of channel 114B along line A-A in a direction perpendicular to the pathway 134B of the channel 114B. This channel 114B includes a first side surface 152B and a second side surface 154B each intersect with a bottom surface 156B at an edge, respectively. In some implementations, these edges may be rounded and/or these sides surfaces may be oriented at various angles with respect to a center axis 135 of the channel 114B. As can be seen, the first side surface 152B intersects with the bottom surface 156B at a first edge 160B with a radius R2 and the second side surface 154B intersects with the bottom surface 156B at a second edge 162B with the radius R2. In some implementations, this radius R2 may range between about 0.5 inches and about 0.01 inches, between about 0.1 inches and about 0.01 inches, or between about 0.1 inches and about 0.01 inches.

The first side surface 152B and the second side surface 154B are oriented at an angle parallel, or substantially parallel (e.g., within 10% of parallel), to the center axis 135 when viewed at an angle perpendicular to the center axis 135, i.e., along the pathway 134. The side surface orientations may also be measured with respect to the bottom surface 156B; as shown, the first side surface 152B and the second side surface 154B are both oriented at an angle θ4 with respect to the bottom surface 156B which may be a perpendicular, or substantially perpendicular (e.g., within 10% of perpendicular), angle. The configuration of these side surfaces may assist with directing the cleaning chemistry flow into the corresponding processing station by, for example, at least partially confining the flow to the recess and creating flow turbulence including flow vortices that may advantageously distribute and mix the flow chemistry. For example, in the channel, the cleaning chemistry may be caused to flow outwards towards the channel side surfaces, then upwards, and then downwards and inwards in a general spiral-like flow pattern as shown with flow 116 in FIG. 2C.

Figure 5A:
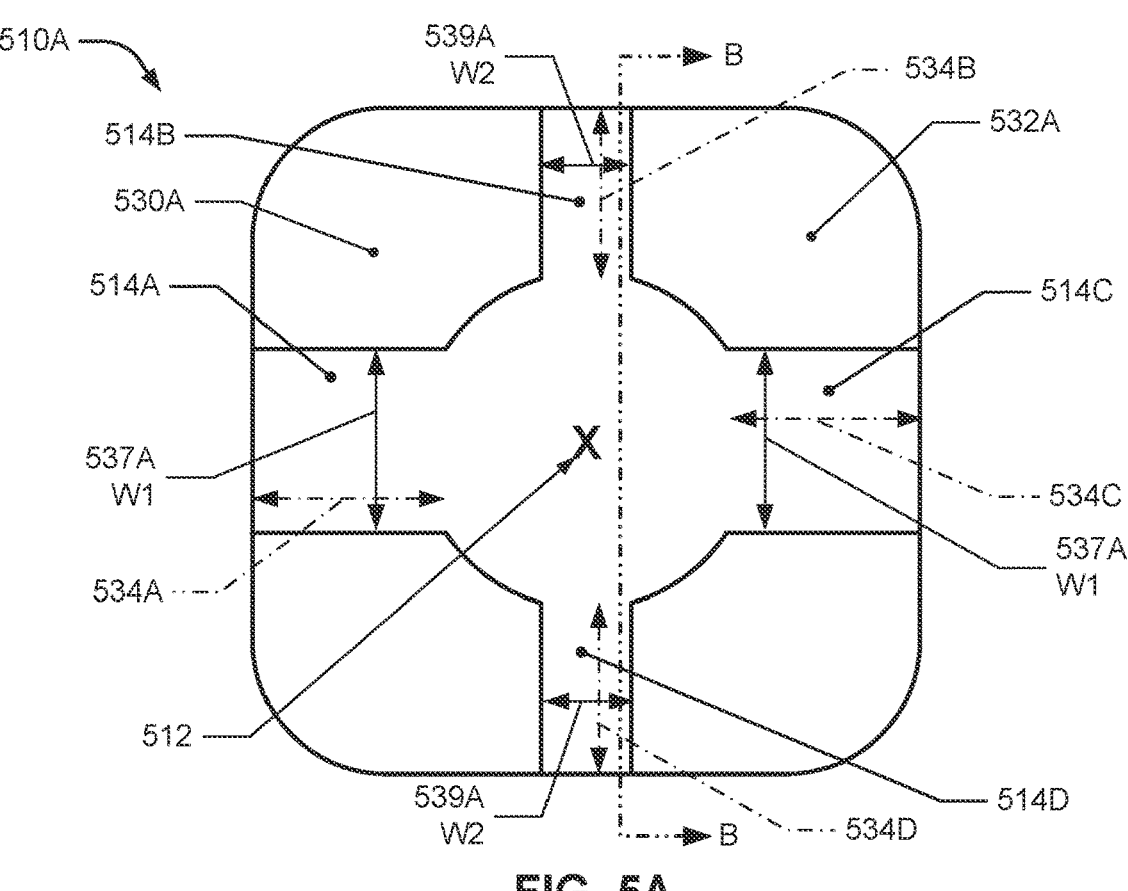
FIG. 5A depicts a top view of another hub in accordance with disclosed embodiments.

In some embodiments, one or more of the hub's channels may have a cross-sectional area that is different than another channel's cross-sectional area, and/or that varies along the pathway. This may include, for example, a hub having four channels with at least one channel having a rectangular cross-sectional area and another channel having a different sized rectangular cross-sectional area. FIG. 5A depicts a top view of another hub in accordance with disclosed embodiments. Here, the hub 510A includes a body 530A with a top surface 532A having a plurality of channels arranged in a radial pattern around the center axis 512. Two channels 514A and 514C of the hub 510A each extend along a respective pathway 534A and 534C, respectively, and each has a first cross-sectional area, represented by lines 537A, that remains constant, or substantially constant, along the pathways 534A and 534C. Two other channels 514B and 514D of the hub 510 each extend along a respective pathway 534B and 534D, respectively, and each has a second cross-sectional area 539A smaller than the first cross-sectional area; the second cross-sectional areas 539A also remains constant, or substantially constant, along the pathways 534B and 534D. As illustrated, the channels 514A and 514C have a width W1, also represented by lines 537A, that is larger than the width W2 of the other channels 514B and 514D, also represented by lines 539A. Here, the first cross-sectional area 537A and the second cross-sectional area 539A may be considered rectangular areas similar to the hub 110 in FIGS. 2A-2C.

Figure 5B:
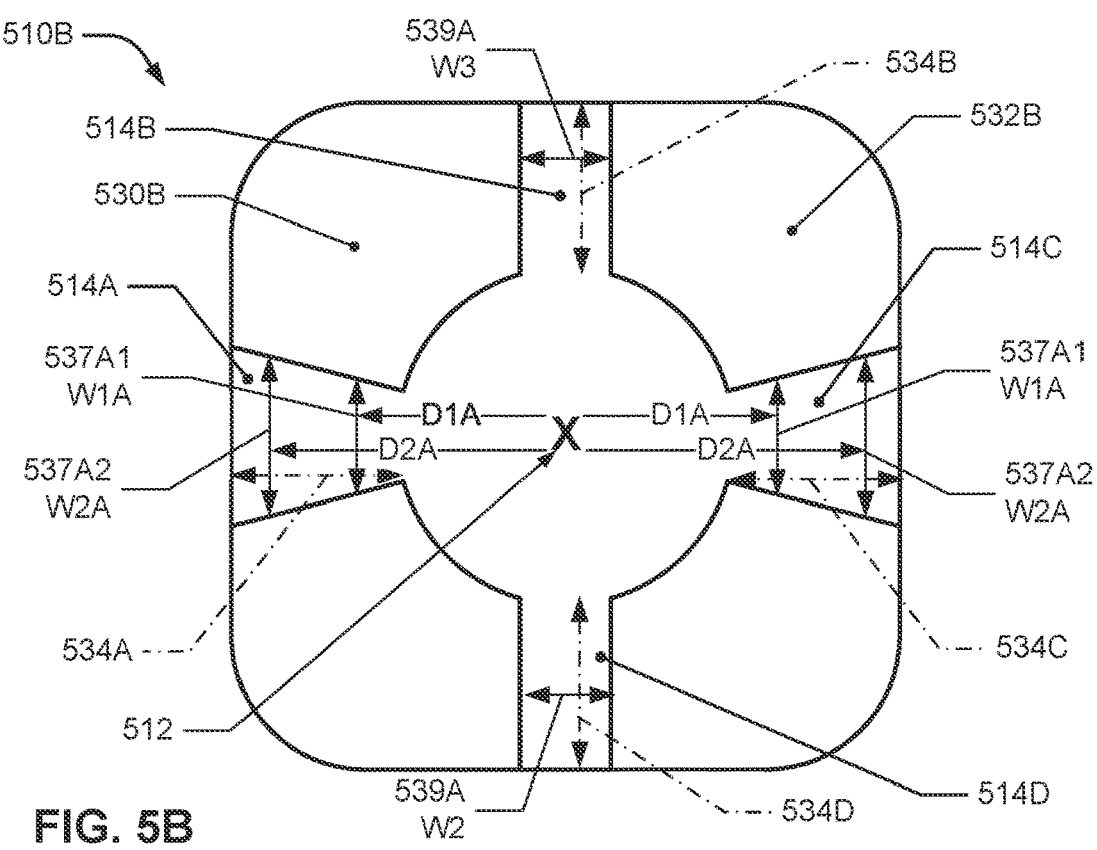
FIG. 5B depicts a top view of yet another hub in accordance with disclosed embodiments.

In some implementations, additionally or alternatively, at least one channel of the hub may have a cross-sectional area that varies along its respective pathway. This may include, for example, a cross-sectional area with a varying height, width, or both. FIG. 5B depicts a top view of yet another hub in accordance with disclosed embodiments. Here, the hub 510B includes a body 530B with a top surface 532B having a plurality of channels arranged in a radial pattern around the center axis 512 and two of these channels have widths that vary, or change, along their respective pathways. Two channels 514A and 514C of the hub 510B each extend along a respective pathway 534A and 534C, respectively, and each has a first cross-sectional area, represented by lines 537A, that varies along the respective pathways 534A and 534C. As illustrated, the channels 514A and 514C have widths that increase as the radial distance from the center axis increases. For example, at a first distance D1A from the center axis 512, the cross-sectional area, represented by line 537A1, of channel 514A has a first width W1A and at a second distance D2A farther from the center axis 512 than the first distance D1A, the cross-sectional area, represented by line 537A2, of channel 514A has a second width W2A that is larger than the first width W1A.

Channel 514C is also similarly configured as channel 514A and is labeled similarly. Two other channels 514B and 514D of the hub 510 each extend along a respective pathway 534B and 534D, respectively, and each has a second cross-sectional area 539B that remains constant, or substantially constant, along the pathways 534B and 534D. Here also, each slice of the first cross-sectional area 537A and the second cross-sectional area 539A may be considered rectangular areas similar to the hub 110, despite the first cross-sectional area's 537A varying width.

Figure 5C:
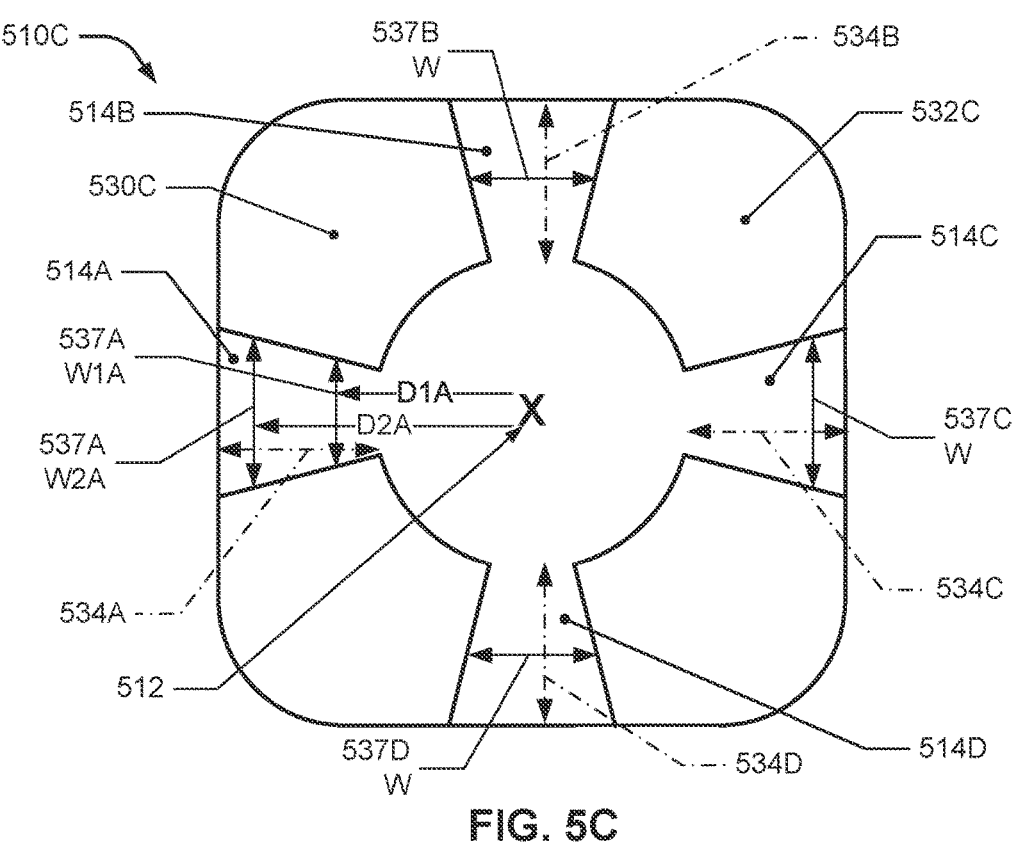
FIG. 5C depicts a top view of a hub in accordance with disclosed embodiments.

In some embodiments, similar to but different than hub 510B, all channels of the hub may have cross-sectional areas that vary along their respective pathways. For instance, all channels of the hub may have cross-sectional areas with widths that vary and increase as the distance along the respective pathway increases from the center axis. FIG. 5C depicts a top view of a hub in accordance with disclosed embodiments. Here, the hub 510C includes a body 530C with a top surface 532C having a plurality of channels arranged in a radial pattern around the center axis 512 and all four of these channels have widths that vary along their respective pathways. Channels 514A-D of hub 510C each extend along a respective pathway 534A-D, respectively, and each has a first cross-sectional area represented by lines 537A that varies along the respective pathways 534A-D such that their widths increase as the radial distance from the center axis increases. For example, at a first distance D1A from the center axis 512, the cross-sectional area, represented by line 537A1, of channel 514A has a first width W1A and at a second distance D2A farther from the center axis 512 than the first distance D1A, the cross-sectional area, represented by line 537A2, of channel 514A has a second width W2A that is larger than the first width W1A. The remaining channels 514B-D are similarly configured with cross-sectional areas 537B-D having variable widths W that increase along the respective pathways 534B-D as the distance from the center axis 512 increases.

Figure 5D:
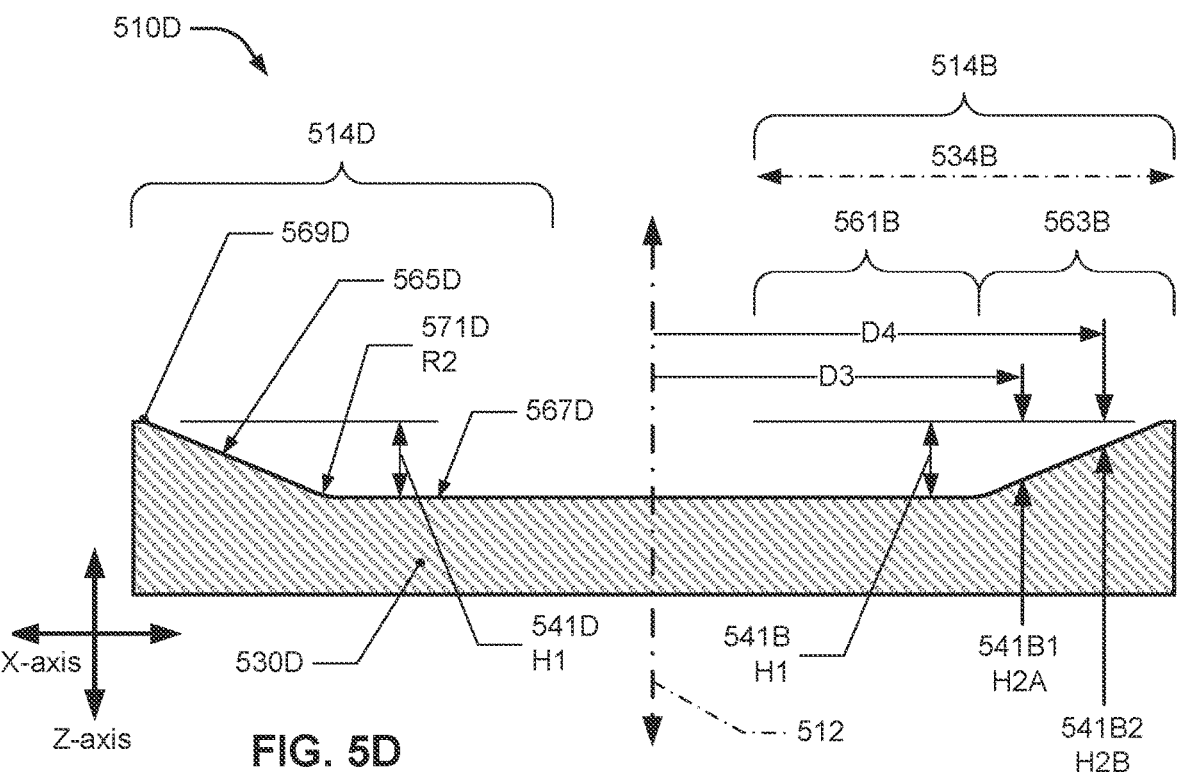
FIG. 5D depicts a cross-sectional side view slice of another hub in accordance with disclosed embodiments.

In some implementations, at least one channel of the hub may have a cross-sectional area that has a variable height along its respective pathway. FIG. 5D depicts a cross-sectional side view slice of another hub in accordance with disclosed embodiments. Here, the hub 510D includes a body 530D with a top surface having a plurality of channels arranged in a radial pattern around the center axis 512, and with each channel extending along a corresponding pathway, such as described above. In FIG. 5D, a cross-sectional slice is taken in a direction parallel to the center axis and along two pathways of two channels, such as representative line B-B in FIG. 5A. The view in FIG. 5D is perpendicular to the center axis and to the pathways of the two channels

514B and 514D. The profiles of these two channels 514B and 514D are visible and as can be seen, each channel has an angled portion configured to cause the cleaning chemistry to flow in an upwards direction, or in a direction parallel to the Z-axis. The cross-sectional areas, represented by lines 541B and 541D, respectively, of these two channels 514B and 514D have a substantially constant height in a first section of the respective channel and a varying, or decreasing, height in a second section of the respective channel. The cross-sectional height of these channels varies as the distance from the center axis increases.

For example, channel 514B extends along pathway 534B and has a cross-sectional area 541B that varies in at least one section of the channel. Here, for a first section 561B of the channel 514B, along the pathway 534B, the height H1 of the cross-sectional area 541B remains constant, or substantially constant. In a second section 563B of the channel 514B, along the pathway 534B, the height H2 of the cross-sectional area 541B varies and decreases as the distance from the center axis 512 increases. For instance, at distance D3 from the center axis 512, the cross-sectional area 541B1 has a first height H2A and at a distance D4 from the center axis 512 that is farther than the first distance D3, the cross-sectional area 541B2 has a second height H2B that is smaller than the first height H2A.

In some embodiments, at least one channel may be described in a different manner, such as defined by a bottom surface, two side surfaces that each intersect the bottom surface, and a front surface that intersects with the two sides and spans between a front edge of the channel and the bottom surface. Channel 514D of FIG. 5D may be defined in such a matter. Here, the channel 514D includes a front surface 565D that spans between a bottom surface 567D of the channel 514D and an outer edge 569D of that channel 514. This outer edge 569D is positioned radially outwards from the bottom surface 567D and is positioned farther away from the center axis 512 than the bottom surface 567D. The front surface 565D may span between the channel's outer edge 569D and the bottom surface 567D along various profiles and paths. This may include a linear path or a path having both linear and curved sections; the front surface 565D in FIG. 5D includes both one linear section and one curved section 571D with radius R2, for example. The front surface 565D may therefore, in some instances, be a planar surface or a nonplanar surface, such as having one or more curved portions, such as the curved edge 571D.

Figure 5E:
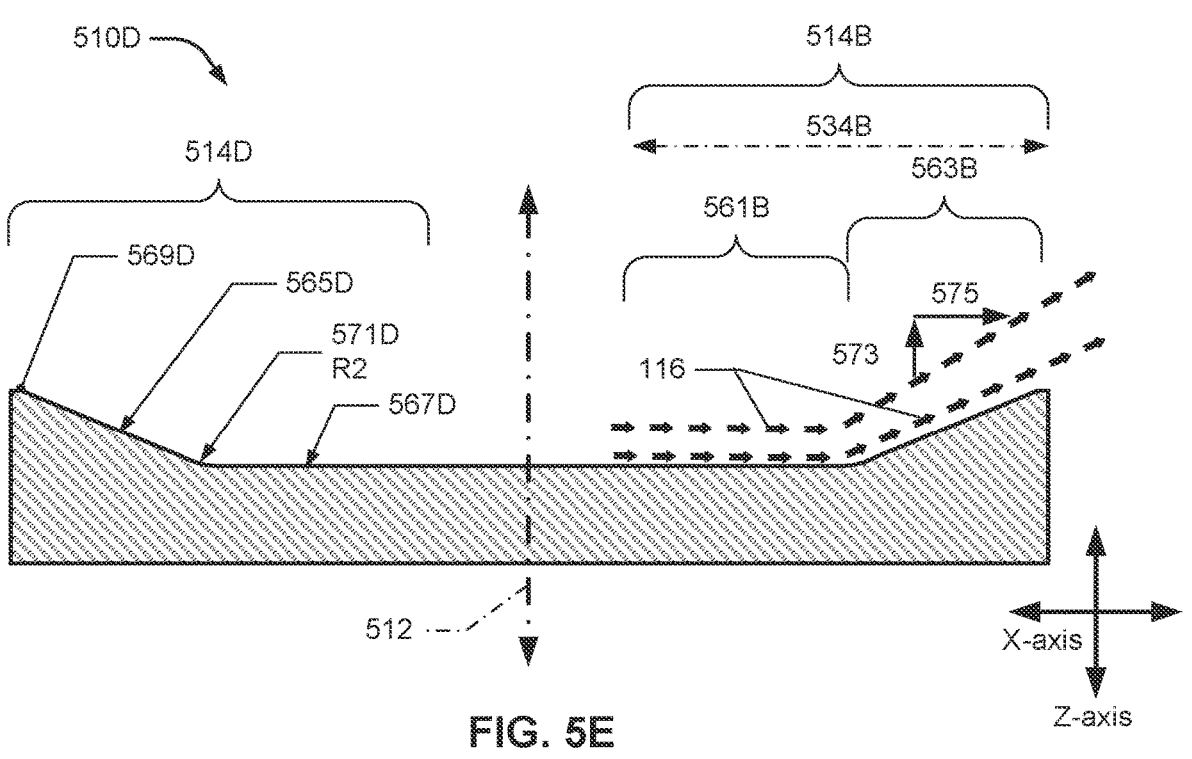
FIG. 5E depicts the hub of FIG. 5D with example gas flows.

The angle of the channels 514B and 514D of hub 510D of FIG. 5D is configured to cause the cleaning chemistry to flow in an upwards and outwards direction. FIG. 5E depicts the hub of FIG. 5D with example gas flows. Here, the cleaning chemistry 116 flows within the channel 514B and the angle of the channel causes, at least in part, the cleaning chemistry flow 116 to flow in a general upwards and radially outwards direction (or vector), e.g., away from the center axis 512, into the chamber interior. The general vector of this flow 116 has both a vertical directional component 573, i.e., a positive or upwards component, in a direction parallel to the center axis 512 (or to the Z-axis) and a horizontal directional component 575 in a direction perpendicular to the center axis 512 (or to the X-axis) and away from the center axis 512. It will be understood that these vectors and directional components may be considered the average nominal, or general, vectors of the cleaning chemistry flows because these flows are gas and/or fluid flows may be imprecise by nature.

In some other implementations, not shown, the cross-sectional height of at least one of these channels may vary along all of its respective pathways instead of only a partial section. In some embodiments, all of the channels of the hub may have channels with variable heights, such as shown in FIG. 5D. In some embodiments, the hub may have two channels with cross-sectional areas that remain constant, or substantially constant, along their respective pathways and two other channels that have cross-sectional areas with varying heights as described herein. In some implementations, one or more channels of the hub may have a cross-sectional area that has both a variable width and a variable height.

Figure 5F:
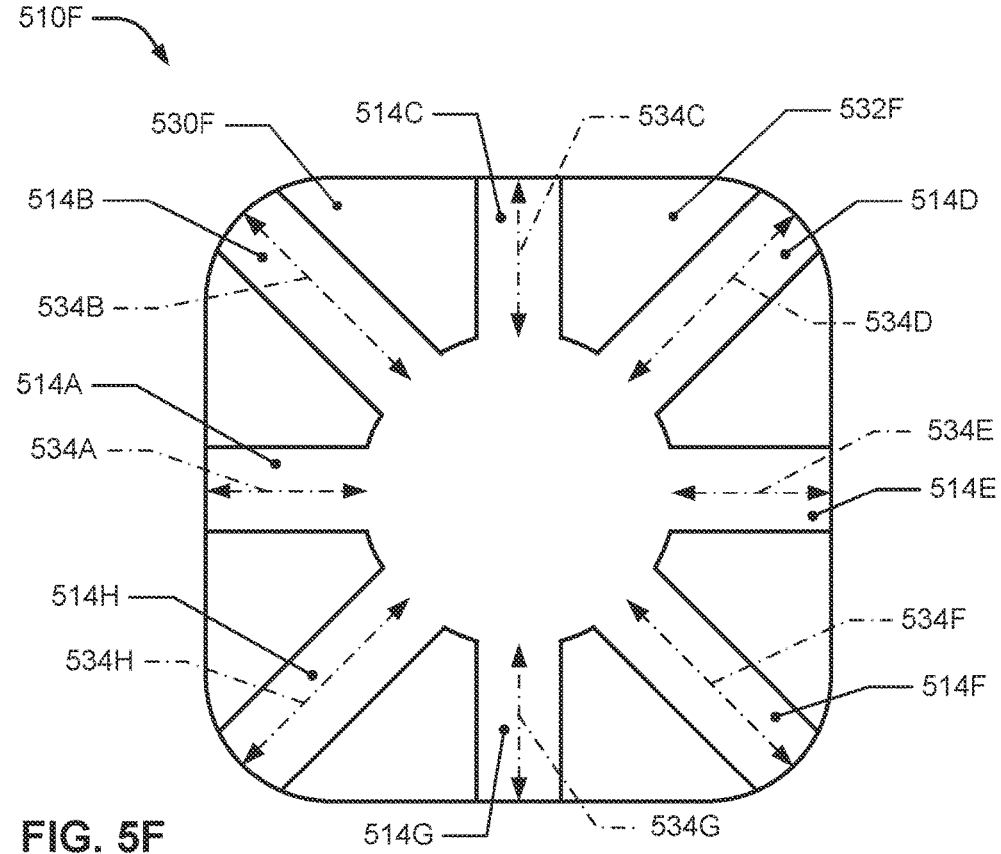
FIG. 5F depicts a top view of another hub in accordance with disclosed embodiments.

In some embodiments, the hub may have more than four channels, such as five, six, seven, or eight, for example. FIG. 5F depicts a top view of another hub in accordance with disclosed embodiments. Here, the hub 510F includes a body 530F with a top surface 532F having eight channels arranged in a radial pattern around the center axis 512. In this example, the eight channels extend along corresponding pathways each may have widths that remain constant, or substantially constant, along their respective pathways. As can be seen, channels 514A-H each extend along a respective pathway 534A-H, respectively, and each has a first cross-sectional area represented by lines 537A that remains constant along the respective pathways 534A-H. These eight channels may be equally spaced about the center axis 512, in some embodiments. In some embodiments, one or more of these channels may have a variable cross-sectional area, such as a variable width, height, or both, for example.

Figure 6:
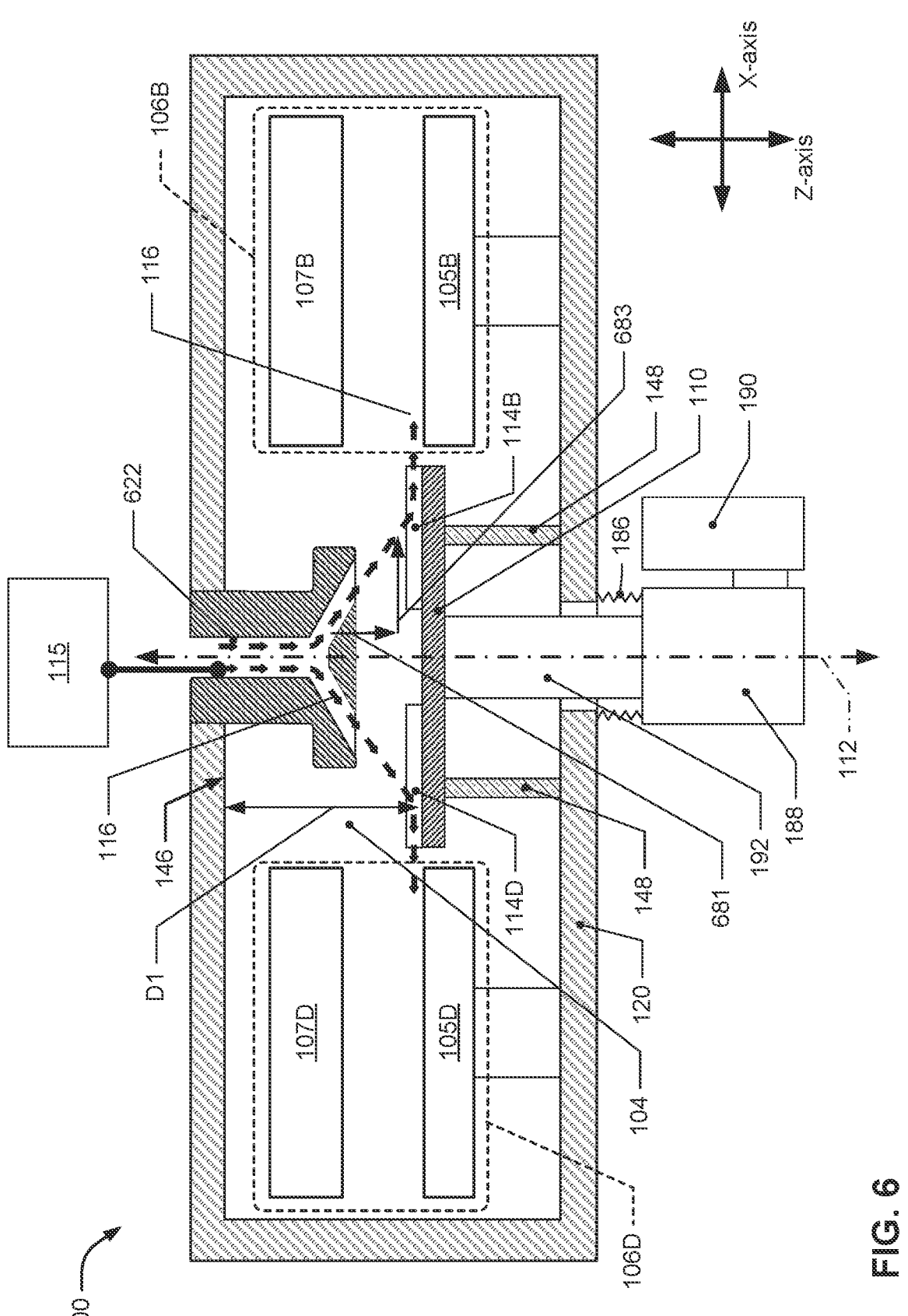
FIG. 6 depicts another multi-station chamber.

In some embodiments, the cleaning chemistry inlet, e.g., a plasma inlet, may be configured in various manners. In some embodiments, this inlet may be configured flow the cleaning chemistry in a single, substantially downwards vertical direction as provided above and shown, for example, in FIGS. 4A and 4B. This includes flowing the cleaning chemistry onto the central area, and in some instances, also onto the channels. In some other embodiments, the inlet may include one or more angled outlets configured to direct the cleaning chemistry at a downwards angle having both vertical and horizontal directional components. FIG. 6 depicts another multi-station chamber. Here, the processing chamber and hub are the same as in FIGS. 4A and 4B, except that the cleaning chemistry inlet 622 has one or more angled outlets. The cleaning chemistry inlet 622 includes a central chamber 680 fluidically connected to a plurality of outlets 682 that may be arranged around the center axis 112. These outlets 682 are configured to cause the cleaning chemistry 116 to flow in a general, relative downwards direction, or vector, from the outlets onto the hub 110 such that this flow has both a vertical directional component 681, i.e., a negative or downwards component, in a direction parallel to the center axis 112 (or to the Z-axis) and a horizontal directional component 683 in a direction perpendicular to the center axis 112 (or within the X-axis and/or Y-axis) and away from the center axis 112.

Techniques

Provided herein are techniques for flowing a cleaning chemistry into a multi-station chamber through a cleaning chemistry inlet and onto a hub as provided herein that directs the cleaning chemistry into various regions of the processing chamber, and by rotating the hub to two or more angular positions during the cleaning process in order to clean multiple areas within the chamber interior. FIG. 7 depicts an example technique in accordance with disclosed embodiments. This technique may use any of the multi-station processing chambers provided herein, including any of the hubs provided above. For example, this may include the multi-station chamber 100 and hub 110 of FIGS. 1A-4B.

In block 701 of FIG. 7, the cleaning chemistry is flowed onto the hub within the multi-station processing chamber while the hub is positioned at a first angular position. This block may coincide with the configuration of FIG. 3A provided above in which the hub 110 is positioned within the center region of the chamber and oriented at, or angled at, the first angular position that may be considered 0 degrees between the reference axis 140 and hub reference axis 142. With the hub at this first angular position, the channels of the hub 110 direct the flow of the cleaning chemistry into the chamber interior 104 and onto various regions in the chamber interior 104, such as representative cleaning chemistry flows 119A-D onto a plurality of regions in the chamber interior 104, including the first regions 121A-D that correspond with and are encompassed by the areas of these flows 119A-D, regions are labeled, respectively shown in FIG. 3A. The first regions 121A-D of the chamber 100 onto which the cleaning chemistry is flowed and cleaned includes, as described above, a portion of each substrate support at each station, such as portion 123B in FIG. 3A, and portions of the chamber sidewalls, such as 125A and 125B in FIG. 3A; these portions include surfaces of the features in the processing chamber interior 104. Although not shown in FIG. 7, some techniques may include an optional operation performed before block 701 in which the hub is rotated to the first angular position from another angular position.

After the cleaning chemistry is flowed onto the hub while the hub is at the first angular position in block 701, the hub may be rotated by a first angle to a second angular position as provided in block 703. Rotating the hub to multiple angular positions allows for multiple areas of the chamber interior to be cleaned by the cleaning chemistry. This rotation is performed as described above and may correspond with FIGS. 3B and/or 3C. For example, in FIG. 3B, the hub 110 has been rotated from its position in FIG. 3A by the first angle θ1 to the second angular position as measured between the hub reference axis 142 and the reference axis 140. In some embodiments, the first angle of block 703 may be greater than 0 degrees and less than 90 degrees, such as greater than 0 and less than or equal to about 60 degrees, greater than 0 and less than or equal to about 45 degrees, greater than 0 and less than or equal to about 30 degrees, greater than 0 and less than or equal to about 15 degrees, between about 60 degrees and less than 90 degrees, for example. In FIG. 3B, the hub has been rotated by about 45 degrees; in some techniques, the first angle of block 703 may be about 45 degrees.

In block 705 of FIG. 7, after the hub has been rotated to the second angular position in block 703, the cleaning chemistry may be flowed onto the hub to thereby direct the cleaning chemistry to a plurality of second regions in the chamber interior. As provided herein, rotating the hub and its channels causes the channels to direct the cleaning chemistry into different regions of the chamber interior; in some instances, these different second regions may overlap with the first regions or may be separate from the first regions. Again referring back to FIG. 3B, the rotation of the hub 110 to the second angular position causes the channels 114A-D of the hub 110 to direct the cleaning chemistry flows 119A-D to different regions of the chamber 100 than in FIG. 3A. In FIG. 3B, the cleaning chemistry flows 119A-D are caused to flow onto second regions 127A-D of the chamber interior 104. The second regions 127A-D here include surfaces of the chamber interior that are in-between the processing stations 106A-D and sidewall areas 129A-D that are also in-between the stations 106A-D. In some instances, the chamber surfaces include support ribs or other support structures and features of the processing chamber 100.

As provided above, the hub may be rotated by other angles and angular positions which causes the hub to direct cleaning chemistry onto other regions of the processing chamber. FIG. 7 includes an optional additional rotation operation and cleaning chemistry flow operation with optional blocks 707 and 709 to represent these additional positions and regions that can be cleaned. In block 707, the hub may be rotated by a second angle to a third angular position, as described above with respect to FIG. 3C. There, the hub 110 has been rotated by the second angle θ2 to the third angular position as measured between the reference axis 140 and the hub reference axis 142 extending through arm 118A. In some embodiments, the second angle may be greater than 0 degrees and less than 90 degrees, such as greater than 0 and less than or equal to about 60 degrees, greater than 0 and less than or equal to about 45 degrees, greater than 0 and less than or equal to about 30 degrees, greater than 0 and less than or equal to about 15 degrees, between about 60 degrees and less than 90 degrees, for example. In FIG. 3B, the hub has been rotated by about 60 degrees from the reference axis 140.

In block 709 of FIG. 7, the cleaning chemistry is flowed onto the hub while the hub is at the third angular position. Again, this block may correspond with FIG. 3C described above which illustrates that this rotation of the hub 110 causes the channels 114A-D of the hub 110 to direct the cleaning chemistry flows 119A-D to different, third regions of the chamber 100. The cleaning chemistry flow 119A-D is caused to flow onto third regions 131A-D of the chamber interior 104. In some embodiments, the third regions may partially overlap with the first regions and/or the second regions.

In some embodiments, the techniques may include stopping and starting the cleaning chemistry flow, and/or raising and lowering the hub as provided herein. FIG. 8 depicts a second technique in accordance with disclosed embodiments. Block 801 may be the same as block 701 in FIG. 7 in which the cleaning chemistry is flowed onto the hub while the hub is at the first angular position. This in turn causes the hub to direct the cleaning chemistry flow into a plurality of first regions of the chamber interior. This block 801 may also correspond with FIG. 3A.

As further illustrated in FIG. 8, some techniques may include actively cooling the hub during the flowing of the cleaning chemistry in blocks 801 and 805, as indicated by block 813. As provided herein and shown in FIG. 4A, for instance, in some embodiments, the cleaning chemistry is flowed onto the hub in block 801 while the hub is at a first vertical distance with respect to a top surface, such as vertical distance D1 in FIG. 4A. In some instances, while at this first vertical distance, the hub can be actively cooled while the cleaning chemistry is flowed onto the hub because, for example, some cleaning chemistries are at temperatures that can adversely affect the hub. The hub may be actively cooled during these cleaning operations in various ways, such as lowering the hub onto a heat sink in the chamber, such as structural elements 148 as shown in FIG. 4A, and/or flowing a cooling fluid, such as a helium gas, from the fluid source 150, within one or more internal cavities of the hub as also shown in FIG. 4A.

After block 801, the cleaning chemistry may be stopped in block 811, and then the hub may be raised to a second vertical offset distance, with respect to the top of the chamber, smaller than the first vertical offset distance in block 815. This may correspond with the offset distance D2 in FIG. 4B. As provided above, the hub may be raised to this second offset distance D2 closer to the top of the chamber for various purposes, such as providing clearance for the hub to be rotated and/or physically separating the hub from the heat sink 148 to prevent unwanted damage and/or particulate generation that may result from the hub rubbing on chamber features or structures during the rotation. In some embodiments, although not stated in the Figure, the technique of FIG. 8 may also include raising the substrate support structures in each processing station which may, for instance, remove some physical obstructions from the rotational path of the hub.

Once at the second vertical offset distance, the hub is rotated in block 803 to the desired angular position. Block 803 may be the same or similar to block 703 and to the rotations provided herein. After this rotation, the hub is lowered back to the first vertical offset position in block 817, such as from the offset D2 in FIG. 4B to the offset D1 in FIG. 4A. Once at this first vertical position, the cleaning chemistry may be flowed onto the hub in block 805 and as provided herein, such as with block 705. As mentioned above, during the flowing of block 805, the hub may again be actively cooled as provided by block 813.

In some embodiments, blocks 701, 705, 801, and 805 may include additional operations, such as starting the flow of the cleaning chemistry. This may include generating a plasma in the remote plasma source and causing the plasma to flow from the source to the chamber inlet. As indicated by block 813, some techniques may include actively cooling the hub during the flowing of operations 701, 705, 801, and 805 as described herein. This may include causing the hub to be in contact with a heat sink structure and/or flowing a heat transfer fluid or cooling fluid within the hub.

In some embodiments, one or more conditions of the cleaning chemistry may be adjusted or changed between the flowing of blocks 701 and 705 and/or blocks 801 and 805. This includes adjusting or changing one or more of the flowrate, pressure, plasma power, plasma frequency, partial pressure, and/or flow time of the cleaning chemistry. For example, block 701 may be performed for time T1 and block 705 may be performed for time T2 greater than T1. In another example, block 801 may be performed with the cleaning chemistry flowrate at flowrate F1, and block 805 may be performed with the cleaning chemistry flowrate at flowrate F2 less than F1. Adjusting one or more of these flow conditions may adjust the nature of the cleaning performed by the cleaning chemistry, such as its ability to remove materials and reach other locations. For example, increasing the flow rate may cause the cleaning chemistry to reach farther into the chamber interior and spread to additional areas.

In some embodiments that have a hub with at least one channel different than another channel, the techniques may position the hub in multiple angular positions so that these different channels can direct cleaning gas flow into various regions of the chamber interior. Because the shapes of the channels can affect the cleaning chemistry flow pattern through the channel and into the chamber interior, different channels can be used for cleaning the same or different areas of the chamber interior. For example, a first channel having a variable height, e.g., a front surface angled upwards, like in FIGS. 5D and 5E, may be advantageous for cleaning some upwards or difficult to reach features in the chamber, such as the underside or faceplate surface of the showerheads in the stations, the top of the chamber, or a stem of a chandelier-type showerhead that attached a showerhead body to the chamber top. In another example, a channel with a substantially constant rectangular cross-sectional area like that in FIGS. 1A and 2A-3D, may advantageously direct the cleaning chemistry onto the chamber walls, the substrate support structures in the stations, or the bottom of the chamber. A hub may have one or more of these channels and it may be advantageous to rotate the hub to multiple angular positions so these different channels can each rotated through a sector of the chamber, such as a 90 degree sector, a 45 degree sector, a 60 degree sector, or a 60 degree to 90 degree sector, for instance. Referring for FIG. 3D, this may include rotating the hub so that each of these channels is positioned within each of these shaded sectors θ1 or θ3.

Additional Variants

Figure 9:
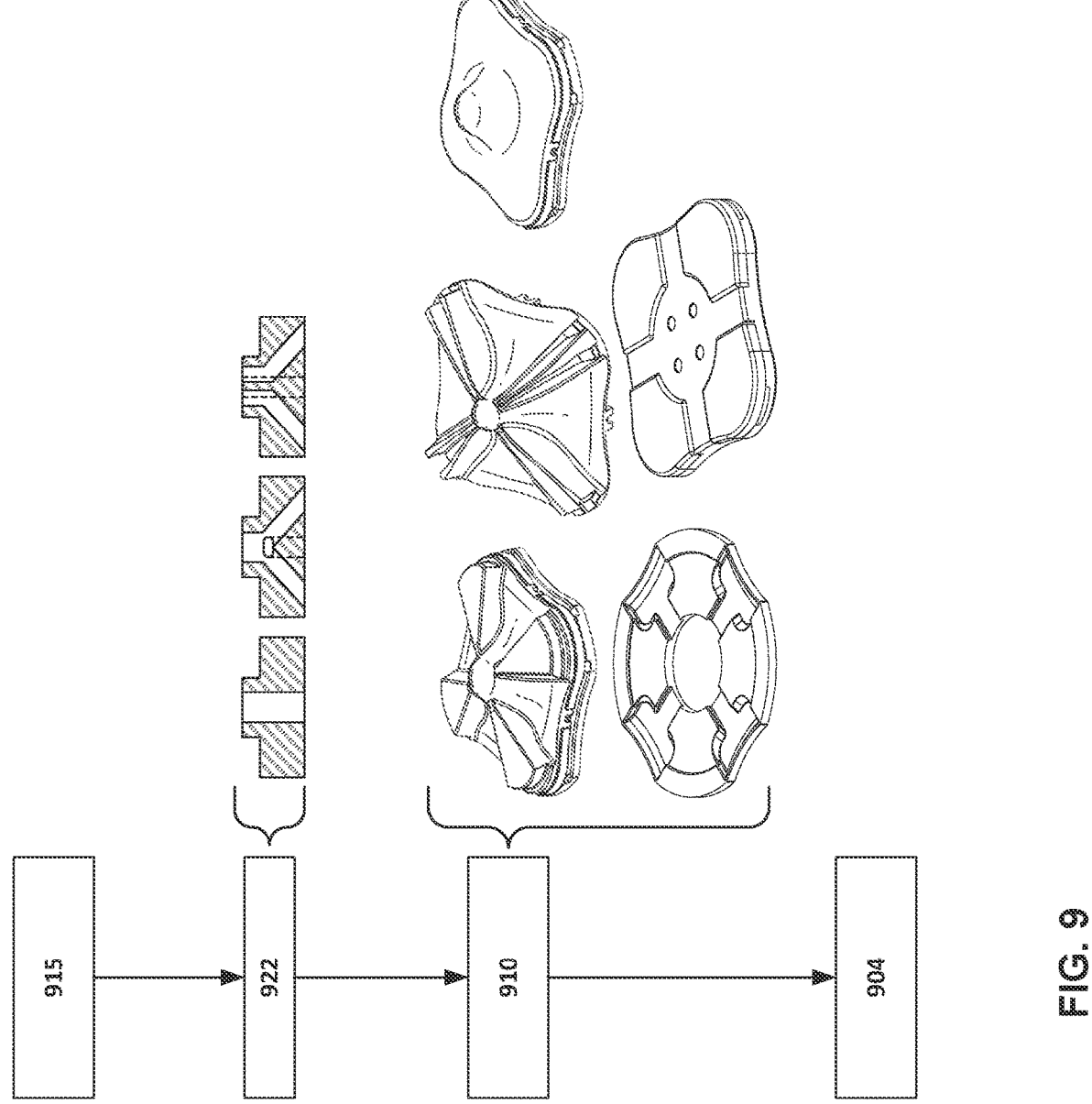
FIG. 9 depicts a schematic diagram of portions of a semiconductor processing chamber that may be used to implement the techniques discussed herein.

It will be understood that the techniques discussed above, as well as additional techniques discussed below, may be practiced in multi-station semiconductor processing tools having a variety of configurations. FIG. 9 depicts a schematic illustrating this. Such semiconductor processing tools may, for example, all have a cleaning chemistry source 915, such as a remote plasma generator, that may supply cleaning chemistry, e.g., a plasma, to a cleaning chemistry inlet 922. The cleaning chemistry inlet 922 may, as shown in FIG. 9, have any of a variety of different configurations.

For example, in some implementations, the cleaning chemistry inlet 922 may feature a single inlet port that directs the cleaning chemistry in a downward direction, e.g., primarily in the vertically downward direction (there will also be some horizontal diffusion/spread of the cleaning chemistry flow, but the bulk of the cleaning chemistry flow may be in the vertical direction; in actual practice, such a flow may develop into a diffuse cone with increasing distance from the cleaning chemistry inlet). An example of such a cleaning chemistry inlet is shown in the implementation at left with respect to the three cross-sectional representations of example cleaning chemistry inlets that are shown to the right of the curly bracket for the cleaning chemistry inlet 922. The cleaning chemistry in such an implementation would be flowed into the cleaning chemistry inlet from the top and then flow through the cleaning chemistry inlet and out the bottom of the cleaning chemistry inlet and into a semiconductor processing chamber. Such a cleaning chemistry inlet is similar to that shown in FIGS. 1B, 4A, and 4B.

In another example, as represented by the middle implementation of the three cross-sections shown for the cleaning chemistry inlet 922, the cleaning chemistry inlet 922 may have a central chamber or passage that is fluidically connected within the cleaning chemistry inlet with a plurality of sloped or curved flow passages or outlets that radiate outward from one end of the central chamber or passage. Such an implementation is similar to that shown in FIG. 6. In such implementations, the cleaning chemistry that is directed into the chamber interior via the cleaning chemistry inlet 922 may be introduced into the chamber interior along directions that are at an oblique angle to vertical, e.g., to an axis parallel to the center axis of the hub 910 (discussed later below), thereby imparting an outward, radial velocity component to the cleaning chemistry that directs the cleaning chemistry so as to flow radially outward from the center.

In yet another example, as represented by the right-most implementation of the three cross-sections shown for the cleaning chemistry inlet 922, the cleaning chemistry inlet 922 may have curved or angled flow passages or outlets that extend radially outward, as with the middle implementation, but instead of such curved or angled flow passages or outlets radiating out from a single common central chamber or passage that supplies cleaning chemistry to all of the curved or angled flow passages or outlets, each curved or angled flow passage or outlet is instead fluidically connected with a separate passage through the cleaning chemistry inlet.

It will be understood that the techniques discussed herein may be practiced with cleaning chemistry inlets such as are discussed above as well as with other cleaning chemistry inlets that serve a similar purpose but are not explicitly discussed herein. Regardless of the type of cleaning chemistry inlet 922 used, the cleaning chemistry inlet 922 may be positioned so as to be generally centered over a hub 910.

The hub 910 may, as discussed earlier, be mounted to an indexer or other wafer transfer mechanism, e.g., a carousel, such that the hub 910 may be rotated relative to the cleaning chemistry inlet 922, as discussed with respect to the examples discussed above. The hub 910 may be equipped with various features, e.g., surfaces, walls, channels, recesses, protrusions, etc., that may be configured so as to redirect the flow of cleaning chemistry that is directed out of the cleaning chemistry inlet 922 in a desired direction or directions, e.g. directions that radiate out from the center of the hub 910 and/or the axis of rotation of the hub 910. In FIG. 9, five example hubs 910 are shown, although it will be understood that hubs may take a variety of other forms as well. Generally speaking, the hub 910 may be designed such that flow of cleaning chemistry onto the hub 910 from the cleaning chemistry inlet 922 is caused to flow radially outward from the hub 910.

The hub 910 may be positioned within a chamber interior 904, e.g., such as is shown in FIGS. 1A, 1B, 3A-4B, and 6, and then used to redirect cleaning chemistry flow provided via the cleaning chemistry inlet 922 radially outward into the chamber interior 904 so as to flow over or across various structures or features within the chamber interior 904. For example, the cleaning chemistry may be directed so as to flow onto, over, or across showerheads that are positioned in wafer processing stations and configured to flow process gas(es) across semiconductor wafers that are positioned in those wafer processing stations, pedestals that are positioned in the wafer processing stations and configured to support the semiconductor wafers during processing operations, interior walls of the chamber interior 904, etc.

As discussed above, the systems discussed herein may, in various implementations, azimuthally re-orient the hub to change the azimuthal direction of the cleaning chemistry flows that radiate outward from the hub.

However, it will also be appreciated that the direction and shape/flow profile of the cleaning chemistry flows may also be changed by moving the hub relative to the cleaning chemistry inlet in other ways. For example, a hub may have different types of features at different radial distances from the center of rotation of the hub. Since the cleaning chemistry flow from the cleaning chemistry inlet will expand in size with increasing distance from the cleaning chemistry inlet, the regions of the hub that are directly impinged by cleaning chemistry that is flowed through the cleaning chemistry inlet may increase or decrease in size with increasing or decreasing distance between the cleaning chemistry inlet and the hub. By locating different types of flow redirection features at different radial distances from the axis of rotation of the hub, it is possible to change how the cleaning chemistry is redirected by varying the vertical distance between the hub and the cleaning chemistry inlet. This is discussed below with respect to some example implementations shown in FIGS. 10-1 through 11-2.

Figures 1, 2, 10:
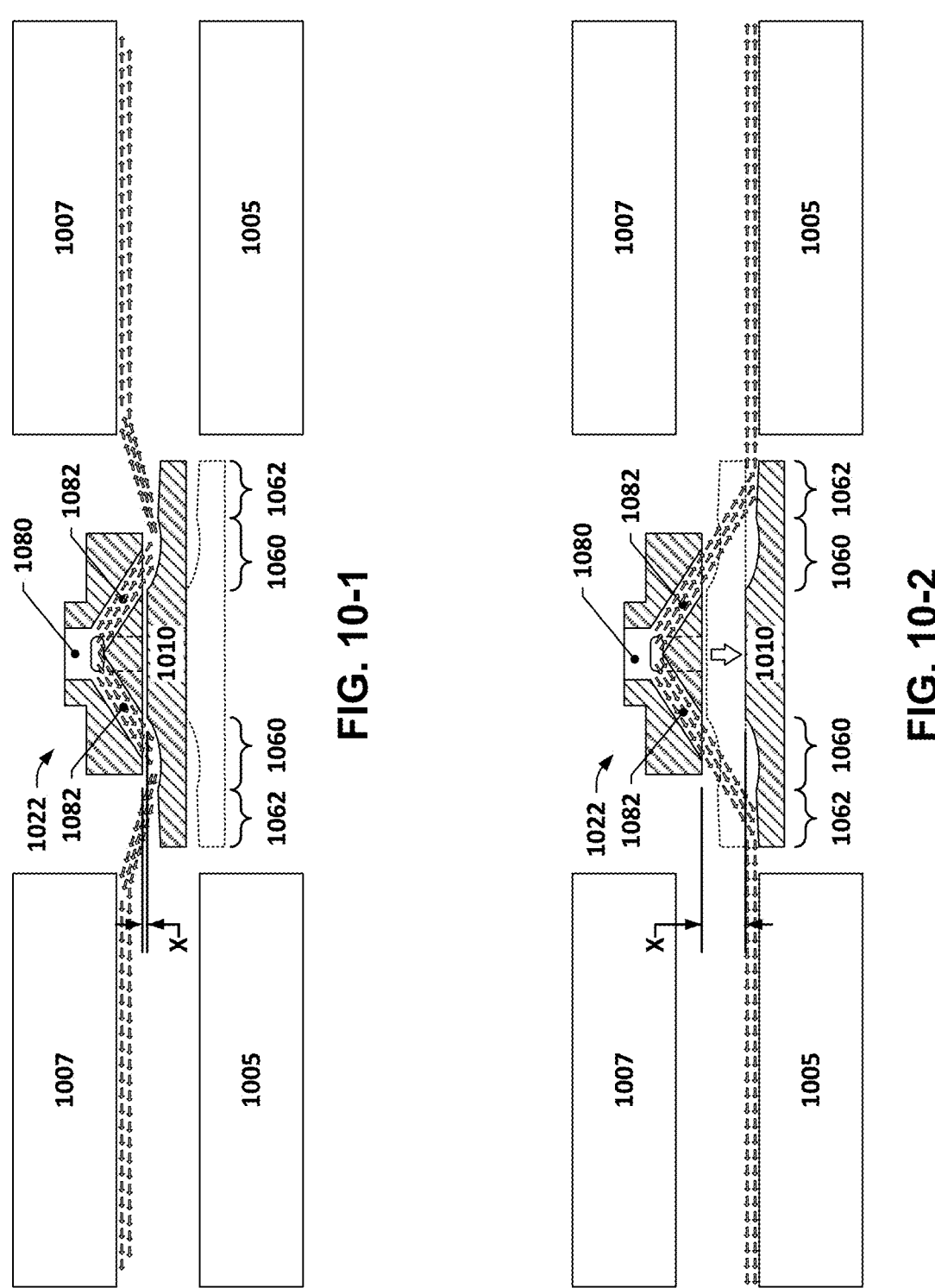
FIGS. 10-1 and 10-2 depict diagrams of portions of an example multi-station semiconductor processing chamber.

FIGS. 10-1 and 10-2 depict diagrams of portions of a multi-station semiconductor processing chamber; the chamber itself is not shown but may be generally similar to the chambers discussed earlier with respect to other Figures discussed herein. Visible in FIGS. 10-1 and 10-2, however, are pedestals 1005 that are arranged on opposite sides of a hub 1010. The hub 1010 may, for example, be a hub for a rotational indexer or other piece of wafer-handling equipment. The pedestals 1005 may, as shown in FIGS. 1A and 3A through 3D, be arranged in a circular array about the hub 1010 so that the rotational indexer, such as the indexer shown in FIGS. 1A and 3A through 3D, is able to be rotated about its center axis to transfer wafers from pedestal 1005 to pedestal 1005.

Also visible in FIGS. 10-1 and 10-2 are showerheads 1007 that are each positioned above a corresponding one of the pedestals 1005. During wafer processing operations, the undersides of the showerheads 1007 and the tops and sides of the pedestals 1005 (and other surfaces as well) may be exposed to processing gases that may deposit undesired films or coatings on such surfaces. Accordingly, the semiconductor processing chamber may be connected with a cleaning chemistry source, e.g., a remote plasma generator (not shown, but see FIG. 1A) via a cleaning chemistry inlet 1022, so that cleaning chemistry, e.g., a plasma, may be flowed into the processing chamber to remove such unwanted deposition from such surfaces.

The hub 1010, in this example, is a plate that has a radial cross-sectional profile in orthogonal section planes that pass through the center of rotation of the hub 1010 that has different geometries in a first radial region 1060 and a second radial region 1062. The second radial region 1062 encircles the first radial region 1060. In this example, the portion of the cross-sectional profile in the first radial region 1060 has a concave shape such that the outermost portion of that section of the cross-sectional profile in the first radial region slopes upward, thus forming a first set of flow redirection features. In contrast, the portion of the cross-sectional profile in the second radial region 1062 has a linear profile that slopes downward with increasing distance from the rotational axis of the hub 1010, thus forming a second set of flow redirection features that are different in geometry and function than the first set of flow redirection features.

When the hub 1010 is at a first elevational position relative to the cleaning chemistry inlet 1022, cleaning chemistry that is directed through the cleaning chemistry inlet 1022, e.g., via a central chamber or passage 1080 and then along radial angled passages 1082, may flow out of the angled passages 1082 and impinge on the radial portion of the hub 1010 that lies within the first radial region 1060. Due to the concavity of the cross-sectional profile in the first radial region 1060 and, more particularly, the fact that the cross-sectional profile in the first radial region 1060 slopes upward as it approaches the boundary between the first radial region 1060 and the second radial region 1062, the impinging cleaning chemistry flow may turn and be redirected at a shallow upward angle so as to impinge against the undersides of the showerheads. Such cleaning chemistry flow may be particularly well-suited to cleaning surfaces of the showerhead 1007.

When the hub 1010 is at a second elevational position relative to the cleaning chemistry inlet 1022, e.g., as shown in FIG. 10-2, the cleaning chemistry exit flows from the cleaning chemistry inlet 1022 may impinge on the hub 1010 at locations that are further out from the center axis of the hub 1010, e.g., within the second radial region 1062. The dimension X in FIGS. 10-1 and 10-2 represents the relative elevational positioning between the hub 1010 and the cleaning chemistry inlet 1022 (in each Figure, the dotted outlines of the hub 1010 represent the position of the hub 1010 in the other Figure). In the depicted implementation, the cross-sectional profile in the second radial region 1062 slopes downward with increasing distance from the center axis. As a result, the impinging cleaning chemistry flows will be redirected so as to flow in a more horizontal or even slightly downward direction, thereby flowing across the pedestals 1005.

It will be readily apparent that by varying the elevational positioning of the hub 1010 relative to the cleaning chemistry inlet 1022, the cleaning chemistry flow from the cleaning chemistry inlet 1022 can be made to primarily impinge on different radial regions of the hub 1010. This allows for the redirected flow of the cleaning chemistry to be altered by modifying the relative elevational positioning of the hub 1010 and the cleaning chemistry inlet 1022 so that the cleaning chemistry impinges on radial regions with different cross-sectional profiles at different relative elevational positions.

The relative elevational positions between the hub 1010 and the cleaning chemistry inlet 1022 may be altered by vertically moving one or both of the hub 1010 and the cleaning chemistry inlet 1022 relative to the other. For example, the hub 1010 may be mounted to an indexer that is configured to be movable along its axis of rotation, e.g., vertically, through actuation of an actuator that raises or lowers the indexer, such as the vertical lift mechanism 190 discussed earlier. Alternatively or additionally, the cleaning chemistry inlet 1022 may be connected with an actuator that allows the cleaning chemistry inlet 1022 to be raised or lowered.

Figures 1, 2, 11:
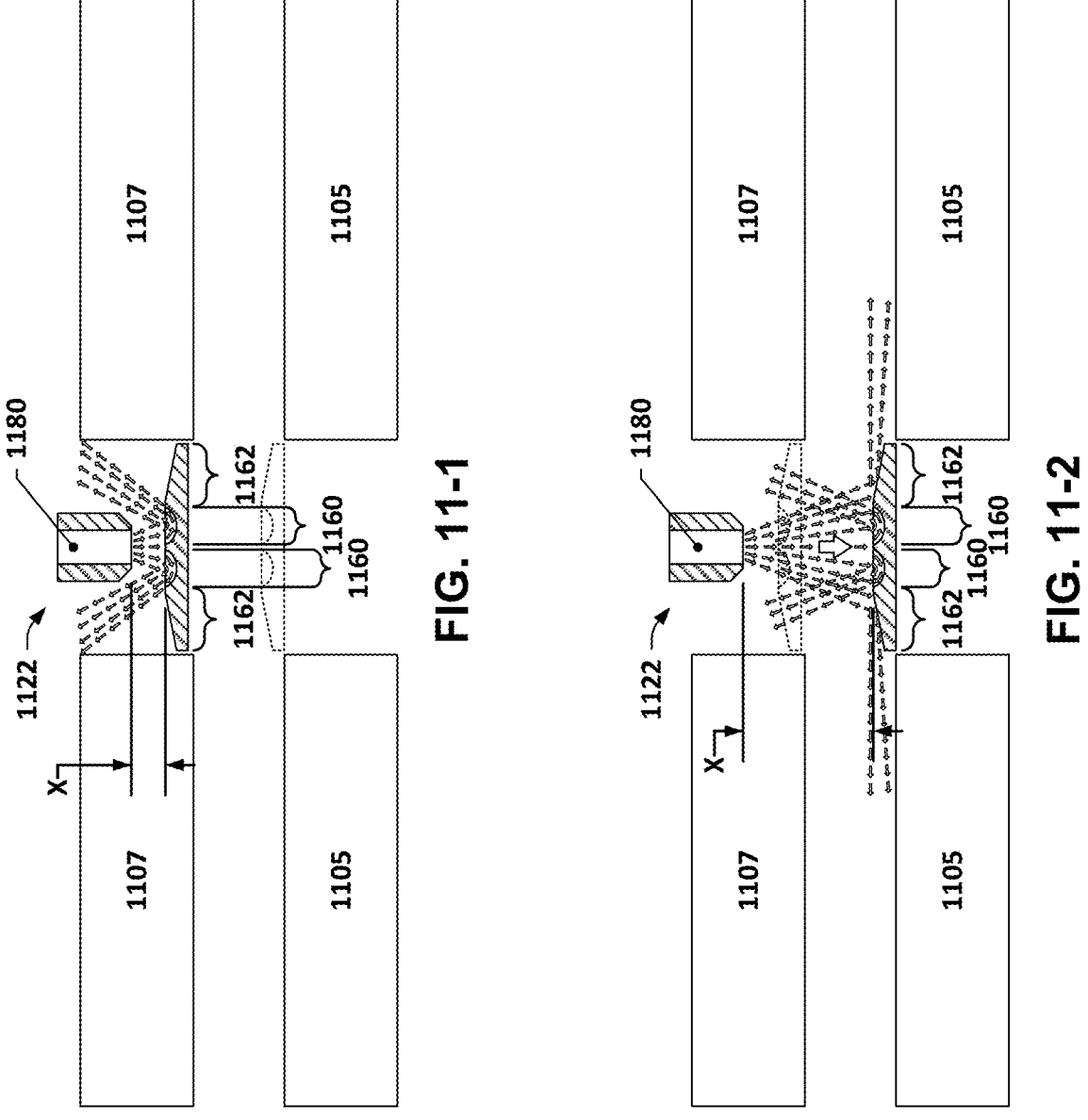

FIGS. 11-1 and 11-2 are similar to FIGS. 10-1 and 10-2 but show a somewhat different implementation. In FIG. 11-1, like FIG. 10-1, portions of a multi-station semiconductor processing chamber are shown. The chamber itself is not shown but may be generally similar to the chambers discussed earlier with respect to other Figures discussed herein. Visible in FIGS. 11-1 and 11-2, however, are pedestals 1105 that are arranged on opposite sides of a hub 1110. The hub 1110 may, for example, be a hub for a rotational indexer or other piece of wafer-handling equipment. The pedestals 1105 may, as shown in FIGS. 1A and 3A through 3D, be arranged in a circular array about the hub 1110 so that the rotational indexer, such as the indexer shown in FIGS. 1A and 3A through 3D, is able to be rotated about its center axis to transfer wafers from pedestal 1105 to pedestal 1105.

Also visible in FIGS. 11-1 and 11-2 are showerheads 1107 that are each positioned above a corresponding one of the pedestals 1105. During wafer processing operations, the undersides of the showerheads 1107 and the tops and sides of the pedestals 1105 (and other surfaces as well) may, as with the example of FIGS. 10-1 and 10-2, be exposed to processing gases that may deposit undesired films or coatings on such surfaces. Accordingly, the semiconductor processing chamber may be connected with a cleaning chemistry source, e.g., a remote plasma generator (not shown, but see FIG. 1A) via a cleaning chemistry inlet 1122, so that cleaning chemistry, e.g., a plasma, may be flowed into the processing chamber to remove such unwanted deposition from such surfaces.

The hub 1110, as with the hub 1010, is a plate that has a radial cross-sectional profile in orthogonal section planes that pass through the center of rotation of the hub 1110 and that has different geometries in a first radial region 1160 and a second radial region 1162. The second radial region 1162 encircles the first radial region 1160. In this example, the portion of the cross-sectional profile in the first radial region 1160 has a concave shape such that the outermost portion of that section of the cross-sectional profile in the first radial region slopes upward. In contrast, the portion of the cross-sectional profile in the second radial region 1162 has a linear profile that slopes downward with increasing distance from the rotational axis of the hub 1110.

When the hub 1110 is at a first elevational position relative to the cleaning chemistry inlet 1122, cleaning chemistry that is directed through the cleaning chemistry inlet 1122, e.g., via a central chamber or passage 1180, may flow out of the central chamber or passage 1180 in a single flow that is at its narrowest where it exits cleaning chemistry inlet 1122 and which then spreads into a diffuse cone with increasing distance from the cleaning chemistry inlet 1122. When at the first elevational position relative to the cleaning chemistry inlet 1122, the spread of the cleaning chemistry flow is relatively constrained due to the hub 1110 being positioned close to the cleaning chemistry inlet 1122. The cleaning chemistry flow thus impinges directly on a smaller, circular area near the center of the hub 1110. The smaller, circular area in this example is within a first radial region 1160. The cross-sectional profile of the hub 1110 in the first radial region 1160 may feature concave features that, like the concave features of the hub 1010, may be shaped so as to redirect the cleaning chemistry flow so as to flow in a new direction. In this example, the concave features are shaped so as to cause the cleaning gas flow to, in effect, make a U-turn and flow upward in a somewhat vertical direction. This may allow the redirected cleaning chemistry to flow past the showerheads 1107 and, for example, impinge on the top of the chamber that houses the structures of FIG. 11-1.

When the hub 1110 is at a second elevational position relative to the cleaning chemistry inlet 1122, e.g., as shown in FIG. 11-2, the cleaning chemistry flow from the cleaning chemistry inlet 1122 may impinge on the hub 1110 at locations that are further out from the center axis of the hub 1122, e.g., within the second radial region 1162, as well as within the first radial region 1160. The dimension X in FIGS. 11-1 and 11-2 represents the relative elevational positioning between the hub 1110 and the cleaning chemistry inlet 1122 in the first and second elevational positions. In the depicted implementation, the cross-sectional profile in the second radial region 1162 slopes downward with increasing distance from the center axis. As a result, part of the impinging cleaning chemistry flow will be redirected so as to flow in a more horizontal or even slightly downward direction, thereby flowing across the pedestals 1105, while another part of the cleaning chemistry flow may be redirected so as to flow towards the top of the chamber.

Figures 1, 2, 3, 4, 5, 12:
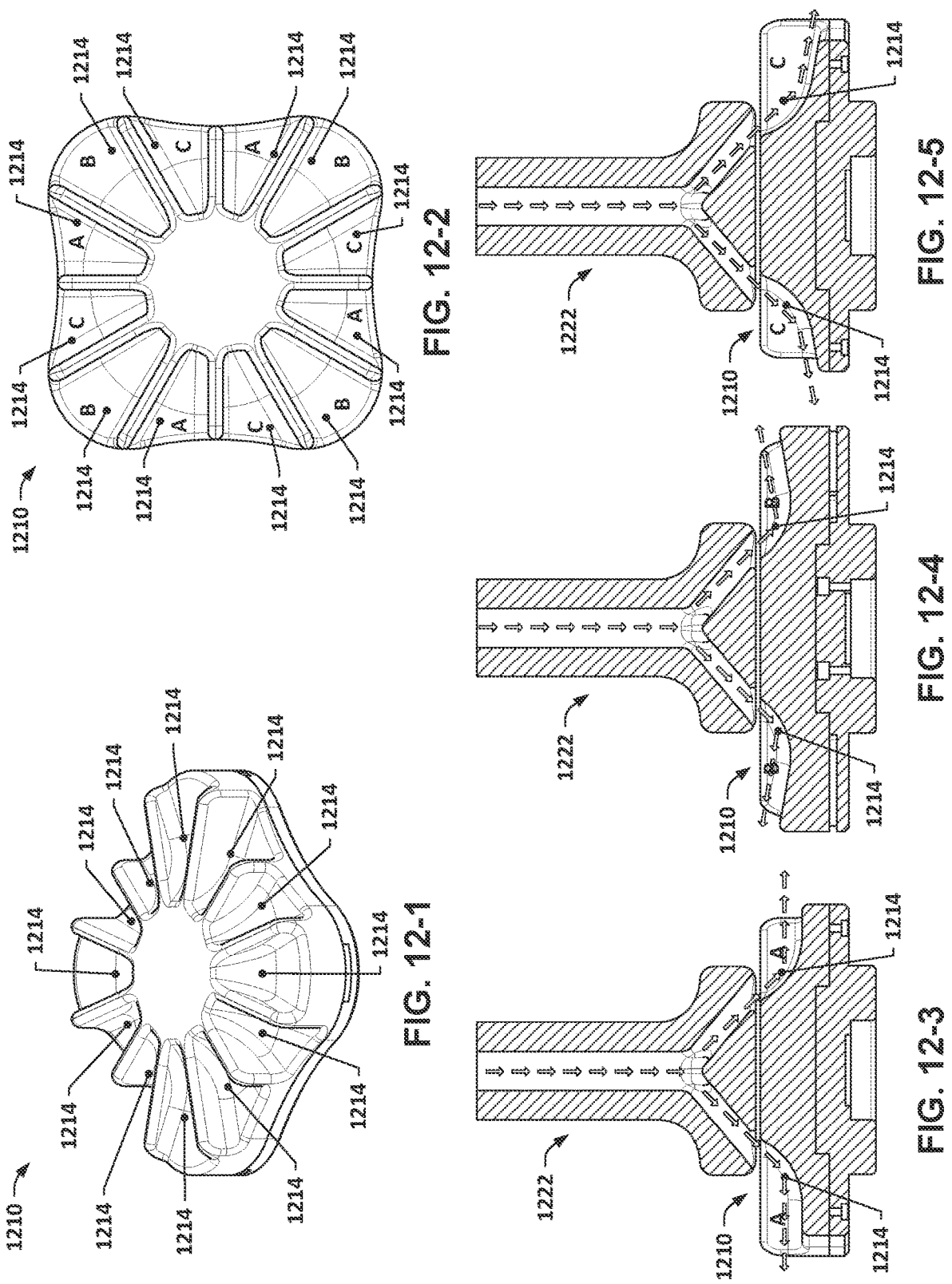

In some implementations, hubs used to redirect cleaning chemistry may also have circumferentially varying features that may allow for the cleaning chemistry to be directed along elevational directions based on the rotational position of the hub. FIGS. 12-1 through 12-5 depict various views of such a hub. In FIG. 12-1, an isometric view of a hub 1210 is shown. The hub 1210 may have a plurality of different types of channels 1214, e.g., flow redirection features, arranged in multiple different concentric circular patterns. The channels 1214 in this example include three sets of different types of channels 1214; each different type of channel 1214 is identified by a different letter A/B/C. Each set includes four channels 1214 of the same type, and the channels 1214 in each set are arranged in a circular array, as can be seen in FIG. 12-2. The channels 1214 marked "A" may have radially outermost surfaces that are generally horizontal. The channels 1214 marked "B" may, in contrast, have outermost surfaces that are sloped upward, while the channels 1214 marked "C" may have outermost surfaces that are sloped downward. Thus, the channels 1214 marked A may have different cross-sectional profiles in corresponding planes that intersect with, and are parallel to, the center axis of the hub 1210 than the channels 1214 marked B or C in corresponding planes that intersect with, and are parallel to, the center axis of the hub 1210. Similarly, the channels 1214 marked C may have different cross-sectional profiles in corresponding planes that intersect with, and are parallel to, the center axis of the hub 1210 than the channels 1214 marked A or B in corresponding planes that intersect with, and are parallel to, the center axis of the hub 1210. The corresponding planes in which these cross-sections are taken may, for example, be arranged in similar circular arrays to the channels 1214 that the sections are being taken of and may, for example, each be a midplane of one of the channels 1214.

When such a hub 1210 is arranged so as to receive cleaning chemistry from a cleaning chemistry inlet 1222 that has multiple separate sloped outlet flow paths, the relative rotational position of the hub 1210 with respect to the cleaning chemistry inlet 1222 may cause the cleaning chemistry flows to flow into a particular set of the channels 1214 depending on that rotational position. For example, when the hub 1210 is positioned such that the outlet flow paths are each positioned so as to direct cleaning chemistry flows into the "A" channels 1214, as shown in FIG. 12-3, the cleaning chemistry may be redirected so as to flow radially outward in a generally horizontal direction by the generally horizontal outermost surfaces of the channels 1214 marked "A."

When the hub 1210 is positioned such that the outlet flow paths are each positioned so as to direct cleaning chemistry flows into the "B" channels 1214, as shown in FIG. 12-4, the cleaning chemistry may be redirected so as to flow radially outward in a somewhat upward direction by the upward-sloped outermost surfaces of the channels 1214 marked "B." And finally, when the hub 1210 is positioned such that the outlet flow paths are each positioned so as to direct cleaning chemistry flows into the "C" channels 1214, as shown in FIG. 12-5, the cleaning chemistry may be redirected so as to flow radially outward in a somewhat downward direction by the downward-sloped outermost surfaces of the channels 1214 marked "C."

In implementations in which there is a set or sets of channels 1214 that are configured to redirect cleaning chemistry in an upward direction, such channels may, for example, be azimuthally aligned with the indexer arms of the indexer to which the hub 1210 maybe mounted. In such an arrangement, the cleaning chemistry is being redirected along an upward direction, thereby limiting the potential of the indexer arms to block a potential cleaning chemistry flow path. This is the case in FIGS. 12-1 through 12-5—as can be seen in FIGS. 12-1, 12-2, and 12-4, the channels 1214 marked "B" are azimuthally positioned above slots in the hub 1210 that are designed to receive and retain indexer arm assemblies of an indexer.

In contrast, in implementations in which there is a set or sets of channels 1214 that redirect cleaning chemistry along horizontal or downward directions, such channels 1214 may be azimuthally aligned with the sectors in between indexer arms, i.e., in locations where the indexer arms are not located. This reduces or eliminates the potential for the indexer arms to potentially obstruct the outward flow of the cleaning chemistry. This is also the case in FIGS. 12-1 through 12-5—as can be seen in FIGS. 12-1, 12-2, 12-3, and 12-5, the channels 1214 marked "A" and "C" are azimuthally positioned in between the slots in the hub 1210 that are designed to receive and retain indexer arm assemblies of an indexer.

It will also be readily apparent that a hub such as the hub 1210 may also be equipped with circumferentially varying cross-sectional profiles that also feature radial variation, as with the examples of FIGS. 10-1 through 11-2. For example, a hub may have different flow redirection features in two different radial zones, as with the examples of FIGS. 10-1 through 11-2, but may also have different flow redirection features within a given radial zone, e.g., as shown in FIGS. 12-1 through 12-5. In such implementations, the relative rotational position of the hub with respect to the cleaning chemistry inlet, as well as the relative elevational position of the hub with respect to the cleaning chemistry inlet, may cause the cleaning chemistry to impinge on the hub so as to strike different types of features that may cause different types of flow redirection in the cleaning chemistry flows. By changing the relative elevational and/or rotational positions of the hub and the cleaning chemistry inlet, the cleaning chemistry flows may be redirected along a plurality of different sets of flow paths to allow the cleaning chemistry flows to be concentrated on different portions or regions of the interior of the processing chamber or components located therein.

Controller

In some embodiments, the multi-station processing chamber 100 described herein may include a controller that is configured to control various aspects of the processing chamber and a semiconductor processing tool or apparatus. Referring back to FIG. 1A, an implementation of a system controller 137 employed to control process conditions and hardware states of the multi-station processing chamber 100 and its processing stations is shown. System controller 137 may include one or more memory devices 143, one or more mass storage devices 145, and one or more processors 147. Processor 147 may include one or more CPUs, ASICs, general-purpose computer(s) and/or specific purpose computer(s), one or more analog and/or digital input/output connection(s), one or more stepper motor controller board (s), etc.

In some implementations, the controller 137 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 137, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controllers provided herein are configured to perform various techniques or processes, such as causing the cleaning chemistry to flow from the cleaning chemistry source, through the inlet, onto the hub positioned at a first angular position, and into the chamber interior, as well as rotating the hub to multiple angular positions. This also includes raising and lowering the hub, actively cooling the hub, and any other movements and techniques described herein, such as the techniques of FIGS. 7 and 8, for instance.

It is to be understood that the use of ordinal indicators, e.g., (a), (b), (c), . . . , herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed before (b) since (b) relies on information obtained in (a)-(c), however, could be performed before or after either of (a) or (b).

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

It will be appreciated that the following non-limiting list of 52 implementations is considered within the scope of the present disclosure. Other implementations not explicitly listed below but evident from the above discussion and the accompanying figures are also to be understood to be within the scope of this disclosure.

Implementation 1: A method of cleaning a multi-station processing chamber including a plurality of processing stations within a chamber interior, a hub located in a center area of the chamber interior, configured to rotate about a center axis, and having a plurality of channels in a top surface of the hub, and a cleaning chemistry inlet configured to direct a cleaning chemistry from a remote source into the chamber interior and onto the top surface of the hub, the method including: flowing, while the hub is at a first angular position with respect to the center axis, the cleaning chemistry from the remote source through the cleaning chemistry inlet and onto the top surface of the hub, and thereby causing the cleaning chemistry to flow through at least some channels in the plurality of channels and into a plurality of first regions within the chamber interior, in which each channel of the at least some channels directs the cleaning chemistry flow into one corresponding first region; rotating, after the flowing of the cleaning chemistry onto the hub while the hub is at the first angular position, the hub by a first angle to a second angular position with respect to the center axis; and flowing, while the hub is at the second angular position, the cleaning chemistry through the cleaning chemistry inlet and onto the top surface of the hub, and thereby causing the cleaning chemistry to flow through at least some channels in the plurality of channels and into a plurality of second regions within the chamber interior, in which each channel of the at least some channels directs the cleaning chemistry flow into one corresponding second region.

Implementation 2: The method of implementation 1, further including positioning, before the flowing of the cleaning chemistry onto the top surface of the hub while the hub is at the first angular position, the hub at the first angular position with respect to the center axis.

Implementation 3: The method of implementation 1, further including stopping, after the flowing of the cleaning chemistry onto the top surface of the hub while the hub is at the first angular position and before the rotating, the flowing of the cleaning chemistry onto the hub.

Implementation 4: The method of implementation 1, in which: the method further includes raising, after the flowing of the cleaning chemistry onto the top surface of the hub while the hub is at the first angular position and before the rotating, the hub along the center axis such that a first vertical offset between the hub and a top of the multi-station processing chamber decreases to a second vertical offset smaller than the first vertical offset, the rotating further includes rotating the hub while the hub is at the second vertical offset, and the method further includes lowering, after the rotating, the hub along the center axis from the second vertical offset to the first vertical offset.

Implementation 5: The method of implementation 4, in which: each processing station includes a substrate support structure, the method further includes raising, after the flowing of the cleaning chemistry onto the top surface of the hub while the hub is at the first angular position and before the rotating, each substrate support structure such that a third vertical offset between each substrate support structure and the top of the multi-station processing chamber decreases to a fourth vertical offset smaller than the third vertical offset, the rotating further includes rotating the hub while the hub is at the second vertical offset and while each substrate support is at the fourth vertical offset, and the method further includes lowering, after the rotating, each substrate support structure from the fourth vertical offset to the third vertical offset.

Implementation 6: The method of implementation 1, further including: rotating, after the flowing of the cleaning chemistry onto the top surface of the hub while the hub is at the second angular position, the hub by a second angle to a third angular position with respect to the center axis; and flowing, while the hub is at the third angular position, the cleaning chemistry through the cleaning chemistry inlet and onto the top surface of the hub, and thereby causing the cleaning chemistry to flow through at least some channels of the plurality of channels and into a plurality of third regions within the chamber interior, in which each channel directs the cleaning chemistry flow into one corresponding third region.

Implementation 7: The method of implementation 1, in which each first region includes a portion of a corresponding sidewall of the multi-station processing chamber.

Implementation 8: The method of implementation 1, in which the first angle is a non-zero angle greater than 0 degrees and less than 90 degrees.

Implementation 9: The method of implementation 1, in which the first angle is a non-zero angle greater than 0 degrees and less than or equal to about 45 degrees, or greater than about 60 degrees and less than about 90 degrees.

Implementation 10: The method of implementation 1, further including actively cooling the hub, during both the flowing while the hub is at the first angular position and the flowing while the hub is at the second angular position, by flowing a heat transfer fluid into one or more internal cavities within the hub and causing the hub to be in thermal contact with a heat transfer section of the multi-station processing chamber.

Implementation 11: The method of implementation 1, in which: the plurality of channels includes a first set of channels and a second set of channels, the channels in the first set of channels are in a first circular array about the center axis, the channels in the second set of channels are in a second circular array about the center axis, the channels in the first set of channels each have a first cross-sectional profile in a corresponding plane that is coincident with, and parallel to, the center axis, the channels in the second set of channels each have a second cross-sectional profile in a corresponding plane that is coincident with, and parallel to, the center axis, the first cross-sectional profiles are different from the second cross-sectional profiles, the cleaning chemistry inlet has a plurality of flow outlets that are configured to direct the cleaning chemistry along a plurality of flow paths that are each at least partially at an oblique angle to an axis parallel to the center axis, the flow outlets of the cleaning chemistry inlet are, in the first angular position, aligned with the channels in the first set of channels, and the flow outlets of the cleaning chemistry inlet are, in the second angular position, aligned with the channels in the second set of channels.

Implementation 12: The method of implementation 11, in which: the hub is part of an indexer having a plurality of indexer arms, each indexer arm extends outward from the hub, the channels in the first set of channels are azimuthally aligned with the indexer arms, and the channels in the second set of channels are azimuthally aligned with sectors in between the indexer arms.

Implementation 13: The method of implementation 11 or implementation 12, in which the first cross-sectional profiles are configured to direct the cleaning chemistry flowed from the cleaning chemistry inlet in a direction that has a radially outward component relative to the center axis and a component that is parallel to the center axis and oriented towards the cleaning chemistry inlet.

Implementation 14: The method of any one of implementations 11 through 13, in which the second cross-sectional profiles are configured to direct the cleaning chemistry flowed from the cleaning chemistry inlet in a direction that has a radially outward component relative to the center axis and, optionally, a component that is parallel to the center axis and oriented away from the cleaning chemistry inlet.

Implementation 15: A system for semiconductor processing, the system including: a multi-station processing chamber that includes: a plurality of side walls and a top that at least partially define a chamber interior, a plurality of processing stations within the chamber interior that each include a substrate support structure configured to support a substrate, a hub having a plurality of channels in a top surface of the hub, the hub located in a center area of the chamber interior, a hub positioning mechanism configured to rotate the hub about a center axis, and a cleaning chemistry inlet configured to direct a flow of a cleaning chemistry into the chamber interior and onto the top surface of the hub; a remote cleaning chemistry source fluidically connected to the cleaning chemistry inlet and configured to flow the cleaning chemistry to the cleaning chemistry inlet; and a controller having at least one processor and at least one memory, in which the at least one memory stores instructions which, when executed by the at least one processor, cause the at least one processor to: cause, while the hub is at a first angular position with respect to the center axis, the cleaning chemistry to flow from the remote cleaning chemistry source through the cleaning chemistry inlet and onto the top surface of the hub, thereby causing the cleaning chemistry to flow through at least some channels of the plurality of channels and into a plurality of first regions within the chamber interior, in which each channel of the at least some channels directs the cleaning chemistry flow into one corresponding first region; cause, after the cleaning chemistry is flowed onto the hub while the hub is at the first angular position, the hub positioning mechanism to rotate the hub by a first angle to a second angular position with respect to the center axis; and cause, while the hub is at the second angular position, the cleaning chemistry to flow through cleaning chemistry inlet and onto the top surface of the hub, thereby causing the cleaning chemistry to flow through at least some channels of the plurality of channels and into a plurality of second regions within the chamber interior, in which each channel of the at least some channels directs the cleaning chemistry flow into one corresponding second region.

Implementation 16: The system of implementation 15, in which the one or more memories further store instructions which, when executed by the at least one processor, further cause the at least one processor to cause, before the cleaning chemistry is flowed onto the top surface of the hub while the hub is at the first angular position, the hub positioning mechanism to position the hub at the first angular position with respect to the center axis.

Implementation 17: The system of implementation 15, in which the one or more memories further store instructions which, when executed by the at least one processor, cause the at least one processor to cause, after the flowing of the cleaning chemistry onto the top surface of the hub while the hub is at the first angular position and before the rotating, the flow of the cleaning chemistry to stop flowing onto the hub.

Implementation 18: The system of implementation 15, in which: the hub positioning mechanism is further configured to raise and lower the hub along the center axis, and the one or more memories further store instructions which, when executed by the at least one processor, cause the at least one processor to cause, after the cleaning chemistry is flowed onto the top surface of the hub while the hub is at the first angular position and before the hub is rotated, the hub positioning mechanism to raise the hub along the center axis such that a first vertical offset between the hub and the top of the multi-station processing chamber decreases to a second vertical offset smaller than the first vertical offset and the hub to be rotated from the first angular position to the second angular position while the hub is at the second vertical offset, and the one or more memories further store instructions which, when executed by the at least one processor, cause the at least one processor, cause, after the hub is rotated, the hub positioning mechanism to lower the hub along the center axis from the second vertical offset to the first vertical offset.

Implementation 19: The system of implementation 18, in which: each substrate support structure is configured to be raised and lowered along a respective center axis that extends through each substrate support structure, the one or more memories further store instructions configured to cause, after the cleaning chemistry is flowed onto the hub while the hub is at the first angular position and before the hub is rotated, each substrate support structure to move upwards along each respective center axis such that a third vertical offset between each substrate support structure and the top of the multi-station processing chamber decreases to a fourth vertical offset smaller than the third vertical offset, the hub is rotated from the first angular position to the second angular position while the hub is at the second vertical offset and while each substrate support is at the fourth vertical offset, and the one or more memories further store instructions which, when executed by the at least one processor, cause the at least one processor to cause, after the hub is rotated, each substrate support structure to move downwards from the fourth vertical offset to the third vertical offset.

Implementation 20: The system of implementation 15, in which the one or more memories further store instructions which, when executed by the at least one processor, cause the at least one processor to: cause, after the cleaning chemistry is flowed onto the hub while the hub is at the second angular position, the hub positioning mechanism to rotate the hub by a second angle to a third angular position with respect to the center axis; and cause, while the hub is at the third angular position, the cleaning chemistry to flow through the cleaning chemistry inlet and onto the hub, and thereby cause the cleaning chemistry to flow through the at least some channels of the plurality of channels and into a plurality of third regions within the chamber interior, in which each channel of the at least some channels of the plurality of channels directs the cleaning chemistry flow into one corresponding third region.

Implementation 21: The system of implementation 15, in which the hub includes four channels.

Implementation 22: The system of implementation 15, in which the hub includes eight channels.

Implementation 23: The system of implementation 15, in which: the plurality of channels includes a first set of channels and a second set of channels, the channels in the first set of channels are in a first circular array about the center axis, the channels in the second set of channels are in a second circular array about the center axis, the channels in the first set of channels each have a first cross-sectional profile in a corresponding plane that is coincident with, and parallel to, the center axis, the channels in the second set of channels each have a second cross-sectional profile in a corresponding plane that is coincident with, and parallel to, the center axis, the first cross-sectional profiles are different from the second cross-sectional profiles, the cleaning chemistry inlet has a plurality of flow outlets that are configured to direct the cleaning chemistry along a plurality of flow paths that are each at least partially at an oblique angle to an axis parallel to the center axis, the flow outlets of the cleaning chemistry inlet are, in the first angular position, aligned with the channels in the first set of channels, and the flow outlets of the cleaning chemistry inlet are, in the second angular position, aligned with the channels in the second set of channels.

Implementation 24: The system of implementation 23, in which: the hub is part of an indexer having a plurality of indexer arms, each indexer arm extends outward from the hub, the channels in the first set of channels are azimuthally aligned with the indexer arms, and the channels in the second set of channels are azimuthally aligned with sectors in between the indexer arms.

Implementation 25: The system of implementation 23 or implementation 24, in which the first cross-sectional profiles are configured to direct the cleaning chemistry flowed from the cleaning chemistry inlet in a direction that has a radially outward component relative to the center axis and a component that is parallel to the center axis and oriented towards the cleaning chemistry inlet.

Implementation 26: The system of any one of implementations 23 through 24, in which the second cross-sectional profiles are configured to direct the cleaning chemistry flowed from the cleaning chemistry inlet in a direction that has a radially outward component relative to the center axis and, optionally, a component that is parallel to the center axis and oriented away from the cleaning chemistry inlet.

Implementation 27: A multi-station processing chamber, including: a plurality of side walls and a top that at least partially define a chamber interior; a plurality of processing stations within the chamber interior, in which each processing station includes a substrate support structure configured to support a substrate; and a substrate movement mechanism located in a center area of the chamber interior and including: a plurality of arms arranged around a center axis, and a hub positioned above the plurality of arms and having a top surface with a plurality of channels arranged in a radial pattern around the center axis, in which: each channel extends along a pathway that extends in a radial direction from a center region of the hub to an edge of the hub, each channel has a cross-sectional area perpendicular to the corresponding pathway, and at least one of the channels has a cross-sectional area that is different than a cross-sectional area of another channel and/or that varies along the pathway.

Implementation 28: The multi-station processing chamber of implementation 27, in which: the at least one channel has a cross-sectional area with a first width that is substantially constant width along that channel's pathway, and at least one other channel has a cross-sectional area with a second width that is smaller than the first width and that is substantially constant along that channel's pathway.

Implementation 29: The multi-station processing chamber of implementation 28, in which: two channels of the plurality of channels each have a cross-sectional area with the first width, and two other channels of the plurality of channels each have a cross-sectional area with the second width.

Implementation 30: The multi-station processing chamber of implementation 27, in which the at least one channel has the cross-sectional area that varies such that the cross-sectional area has: a first height at a first distance from the center axis along the pathway of the at least one channel, and a second height smaller than the first height at a second distance from the center axis along the pathway of the at least one channel that is greater than the first distance.

Implementation 31: The multi-station processing chamber of implementation 30, in which: the at least one channel includes a front surface that spans between a bottom surface of the at least one channel and an outer edge of the at least one channel, and the front surface is a substantially planar surface.

Implementation 32: The multi-station processing chamber of implementation 30, in which: the at least one channel includes a front surface that spans between a bottom surface of the at least one channel and an outer edge of the at least one channel, and the front surface is a nonplanar surface.

Implementation 33: The multi-station processing chamber of implementation 30, in which all the channels of the plurality of channels have the cross-sectional area that varies such that the cross-sectional area of each channel has: the first height at the first distance from the center axis along the pathway of the corresponding channel, and the second height smaller than the first height at the second distance from the center axis along the pathway of the corresponding channel that is greater than the first distance.

Implementation 34: The multi-station processing chamber of implementation 30, in which: a second channel has the cross-sectional area that varies such that the cross-sectional area of the second channel has the first height at the first distance from the center axis along the pathway of the second channel, and the second height smaller than the first height at the second distance from the center axis along the pathway of the second channel that is greater than the first distance, and two other channels each have a cross-sectional area that remains substantially constant along the corresponding pathway of each channel.

Implementation 35: The multi-station processing chamber of implementation 27, in which the at least one channel has a cross-sectional area that varies such that the cross-sectional area has: a first width at a first distance from the center axis along the pathway of the at least one channel, and a second width larger than the first width at a second distance from the center axis along the pathway of the at least one channel that is greater than the first distance.

Implementation 36: The multi-station processing chamber of implementation 35, in which all the channels of the plurality of channels have a cross-sectional area that varies such that the cross-sectional area of each channel has: the first width at the first distance from the center axis along the pathway of the corresponding channel, and the second width larger than the first width at the second distance from the center axis along the pathway of the corresponding channel that is greater than the first distance.

Implementation 37: The multi-station processing chamber of implementation 35, in which a second channel has the cross-sectional area that varies such that the cross-sectional area of the second channel has the first width at the first distance from the center axis along the pathway of the second channel, and the second width larger than the first width at the second distance from the center axis along the pathway of the second channel that is greater than the first distance, and two other channels each have a cross-sectional area that remains substantially constant along the corresponding pathway of each channel.

Implementation 38: A method of cleaning a multi-station processing chamber having a plurality of processing stations within a chamber interior, a hub located in a center area of the chamber interior, configured to be moveable along a vertical center axis of the hub relative to the chamber, and having a first set of flow redirection features in a first radial region of a top surface of the hub and a second set of flow redirection features in a second radial region of the top surface of the hub which is concentric with the first radial region, and a cleaning chemistry inlet configured to direct a cleaning chemistry from a remote source into the chamber interior and onto the top surface of the hub, in which: one of the first radial region and the second radial region is encircled by the other of the first radial region and the second radial region, the flow redirection features in the first set of flow redirection features each have a first cross-sectional profile in a corresponding plane that is coincident with, and parallel to, the vertical center axis, the flow redirection features in the second set of flow redirection features each have a second cross-sectional profile in a corresponding plane that is coincident with, and parallel to, the vertical center axis, and the method includes: flowing, while the hub is at a first elevational position with respect to the cleaning chemistry inlet, the cleaning chemistry from the remote source through the cleaning chemistry inlet and onto the top surface of the hub, thereby causing the cleaning chemistry to impinge on the flow redirection features in the first set of flow redirection features and be directed along a first outward direction; moving the hub from the first elevational position to a second elevational position; and flowing, while the hub is at the second elevational position with respect to the cleaning chemistry inlet, the cleaning chemistry from the remote source through the cleaning chemistry inlet and onto the top surface of the hub, thereby causing the cleaning chemistry to impinge on the flow redirection features in the second set of flow redirection features and be directed along a second outward direction, in which the first outward direction and the second outward direction are different.

Implementation 39: The method of implementation 38, in which the cleaning chemistry inlet has a plurality of flow outlets that are configured to direct the cleaning chemistry along a plurality of flow paths that are each at least partially at an oblique angle to an axis parallel to the vertical center axis.

Implementation 40: The method of implementation 38, in which the cleaning chemistry inlet has a single flow outlet configured to direct the cleaning chemistry along the vertical center axis.

Implementation 41: The method of any one of implementations 38 through 40, in which the first cross-sectional profiles are configured to direct the cleaning chemistry flowed from the cleaning chemistry inlet in a direction that has a radially outward component relative to the vertical center axis and a component that is parallel to the vertical center axis and oriented towards the cleaning chemistry inlet.

Implementation 42: The method of any one of implementations 38 through 41, in which the second cross-sectional profiles are configured to direct the cleaning chemistry flowed from the cleaning chemistry inlet in a direction that has a radially outward component relative to the vertical center axis and, optionally, a component that is parallel to the vertical center axis and oriented away from the cleaning chemistry inlet.

Implementation 43: The method of any one of implementations 38 through 42, in which the first radial region encircles the second radial region.

Implementation 44: The method of any one of implementations 38 through 42, in which the second radial region encircles the first radial region.

Implementation 45: A multi-station semiconductor processing system including: a chamber having a plurality of processing stations within a chamber interior of the chamber; a hub located in a center area of the chamber interior, configured to be moveable along a vertical center axis of the hub relative to the chamber, and having a first set of flow redirection features in a first radial region of a top surface of the hub and a second set of flow redirection features in a second radial region of the top surface of the hub which is concentric with the first radial region; a cleaning chemistry inlet configured to direct a cleaning chemistry from a remote source into the chamber interior and onto the top surface of the hub; and a controller having at least one processor and at least one memory, in which: one of the first radial region and the second radial region is encircled by the other of the first radial region and the second radial region, the flow redirection features in the first set of flow redirection features each have a first cross-sectional profile in a corresponding plane that is coincident with, and parallel to, the vertical center axis, the flow redirection features in the second set of flow redirection features each have a second cross-sectional profile in a corresponding plane that is coincident with, and parallel to, the vertical center axis, and the at least one memory stores instructions which, when executed by the at least one processor, cause the at least one processor to: cause, while the hub is at a first elevational position with respect to the cleaning chemistry inlet, the cleaning chemistry to flow from the remote source through the cleaning chemistry inlet and onto the top surface of the hub, thereby causing the cleaning chemistry to impinge on the flow redirection features in the first set of flow redirection features and be directed along a first outward direction; cause the hub to move from the first elevational position to a second elevational position; and cause, while the hub is at the second elevational position with respect to the cleaning chemistry inlet, the cleaning chemistry to flow from the remote source through the cleaning chemistry inlet and onto the top surface of the hub, thereby causing the cleaning chemistry to impinge on the flow redirection features in the second set of flow redirection features and be directed along a second outward direction, in which the first outward direction and the second outward direction are different.

Implementation 46: The multi-station semiconductor processing system of implementation 45, in which the cleaning chemistry inlet has a plurality of flow outlets that are configured to direct the cleaning chemistry along a plurality of flow paths that are each at least partially at an oblique angle to an axis parallel to the vertical center axis.

Implementation 47: The multi-station semiconductor processing system of implementation 45, in which the cleaning chemistry inlet has a single flow outlet configured to direct the cleaning chemistry along the vertical center axis.

Implementation 48: The multi-station semiconductor processing system of any one of implementations 45 through 47, in which the first cross-sectional profiles are configured to direct the cleaning chemistry flowed from the cleaning chemistry inlet in a direction that has a radially outward component relative to the vertical center axis and a component that is parallel to the vertical center axis and oriented towards the cleaning chemistry inlet.

Implementation 49: The multi-station semiconductor processing system of any one of implementations 45 through 48, in which the second cross-sectional profiles are configured to direct the cleaning chemistry flowed from the cleaning chemistry inlet in a direction that has a radially outward component relative to the vertical center axis and, optionally, a component that is parallel to the vertical center axis and oriented away from the cleaning chemistry inlet.

Implementation 50: The multi-station semiconductor processing system of any one of implementations 45 through 49, in which the first radial region encircles the second radial region.

Implementation 51: The multi-station semiconductor processing system of any one of implementations 45 through 49, in which the second radial region encircles the first radial region.

Implementation 52: A multi-station semiconductor processing system including: a chamber having a plurality of processing stations within a chamber interior of the chamber; a structure located in the chamber interior and configured to be moveable along a vertical center axis; a cleaning chemistry inlet configured to direct a cleaning chemistry from a remote source into the chamber interior and onto the structure; and a controller having at least one processor and at least one memory, in which: the at least one memory stores instructions which, when executed by the at least one processor, cause the at least one processor to: cause, while the structure is at a first elevational position with respect to the cleaning chemistry inlet, the cleaning chemistry to flow from the remote source through the cleaning chemistry inlet and onto the structure, thereby causing the cleaning chemistry to be directed along a first outward direction; cause the structure to move from the first elevational position to a second elevational position; and cause, while the structure is at the second elevational position with respect to the cleaning chemistry inlet, the cleaning chemistry to flow from the remote source through the cleaning chemistry inlet and onto the structure, thereby causing the cleaning chemistry to be directed along a second outward direction, in which the first outward direction and the second outward direction are different.

What is claimed is:

1. A method of cleaning a multi-station processing chamber comprising a plurality of processing stations within a chamber interior, a hub located in a center area of the chamber interior, configured to rotate about a center axis, and having a plurality of channels in a top surface of the hub, and a cleaning chemistry inlet configured to direct a cleaning chemistry from a remote source into the chamber interior and onto the top surface of the hub, the method comprising:

flowing, while the hub is at a first angular position with respect to the center axis, the cleaning chemistry from the remote source through the cleaning chemistry inlet and onto the top surface of the hub, and thereby causing the cleaning chemistry to flow through at least some channels in the plurality of channels and into a plurality of first regions within the chamber interior, wherein each channel of the at least some channels directs the cleaning chemistry flow into one corresponding first region;

rotating, after the flowing of the cleaning chemistry onto the hub while the hub is at the first angular position, the hub by a first angle to a second angular position with respect to the center axis; and flowing, while the hub is at the second angular position, the cleaning chemistry through the cleaning chemistry inlet and onto the top surface of the hub, and thereby causing the cleaning chemistry to flow through at least some channels in the plurality of channels and into a plurality of second regions within the chamber interior, wherein each channel of the at least some channels directs the cleaning chemistry flow into one corresponding second region.

2. The method of claim 1, further comprising:

positioning, before the flowing of the cleaning chemistry onto the top surface of the hub while the hub is at the first angular position, the hub at the first angular position with respect to the center axis.

3. The method of claim 1, further comprising:

stopping, after the flowing of the cleaning chemistry onto the top surface of the hub while the hub is at the first angular position and before the rotating, the flowing of the cleaning chemistry onto the hub.

4. The method of claim 1, wherein:

the method further comprises raising, after the flowing of the cleaning chemistry onto the top surface of the hub while the hub is at the first angular position and before the rotating, the hub along the center axis such that a first vertical offset between the hub and a top of the multi-station processing chamber decreases to a second vertical offset smaller than the first vertical offset, the rotating further includes rotating the hub while the hub is at the second vertical offset, and the method further comprises lowering, after the rotating, the hub along the center axis from the second vertical offset to the first vertical offset.

5. The method of claim 4, wherein:

each processing station includes a substrate support structure, the method further comprises raising, after the flowing of the cleaning chemistry onto the top surface of the hub while the hub is at the first angular position and before the rotating, each substrate support structure such that a third vertical offset between each substrate support structure and the top of the multi-station processing chamber decreases to a fourth vertical offset smaller than the third vertical offset, the rotating further includes rotating the hub while the hub is at the second vertical offset and while each substrate support is at the fourth vertical offset, and the method further comprises lowering, after the rotating, each substrate support structure from the fourth vertical offset to the third vertical offset.

6. The method of claim 1, further comprising:

rotating, after the flowing of the cleaning chemistry onto the top surface of the hub while the hub is at the second angular position, the hub by a second angle to a third angular position with respect to the center axis; and flowing, while the hub is at the third angular position, the cleaning chemistry through the cleaning chemistry inlet and onto the top surface of the hub, and thereby causing the cleaning chemistry to flow through at least some channels of the plurality of channels and into a plurality of third regions within the chamber interior, wherein each channel directs the cleaning chemistry flow into one corresponding third region.

7. The method of claim 1, wherein each first region includes a portion of a corresponding sidewall of the multi-station processing chamber.

8. The method of claim 1, wherein the first angle is a non-zero angle greater than 0 degrees and less than 90 degrees.

9. The method of claim 1, wherein the first angle is a non-zero angle greater than 0 degrees and less than or equal to about 45 degrees, or greater than about 60 degrees and less than about 90 degrees.

10. The method of claim 1, further comprising:

actively cooling the hub, during both the flowing while the hub is at the first angular position and the flowing while the hub is at the second angular position, by flowing a heat transfer fluid into one or more internal cavities within the hub and causing the hub to be in thermal contact with a heat transfer section of the multi-station processing chamber.

11. The method of claim 1, wherein:

the plurality of channels includes a first set of channels and a second set of channels, the channels in the first set of channels are in a first circular array about the center axis, the channels in the second set of channels are in a second circular array about the center axis, the channels in the first set of channels each have a first cross-sectional profile in a corresponding plane that is coincident with, and parallel to, the center axis, the channels in the second set of channels each have a second cross-sectional profile in a corresponding plane that is coincident with, and parallel to, the center axis, the first cross-sectional profiles are different from the second cross-sectional profiles, the cleaning chemistry inlet has a plurality of flow outlets that are configured to direct the cleaning chemistry along a plurality of flow paths that are each at least partially at an oblique angle to an axis parallel to the center axis, the flow outlets of the cleaning chemistry inlet are, in the first angular position, aligned with the channels in the first set of channels, and the flow outlets of the cleaning chemistry inlet are, in the second angular position, aligned with the channels in the second set of channels.

12. The method of claim 11, wherein:

the hub is part of an indexer having a plurality of indexer arms, each indexer arm extends outward from the hub, the channels in the first set of channels are azimuthally aligned with the indexer arms, and the channels in the second set of channels are azimuthally aligned with sectors in between the indexer arms.

13. The method of claim 11, wherein the first cross-sectional profiles are configured to direct the cleaning chemistry flowed from the cleaning chemistry inlet in a direction that has a radially outward component relative to the center axis and a component that is parallel to the center axis and oriented towards the cleaning chemistry inlet.

14. The method of claim 11, wherein the second cross-sectional profiles are configured to direct the cleaning chemistry flowed from the cleaning chemistry inlet in a direction that has a radially outward component relative to the center axis and, optionally, a component that is parallel to the center axis and oriented away from the cleaning chemistry inlet.

15. A system for semiconductor processing, the system comprising:

a multi-station processing chamber that comprises:

a plurality of side walls and a top that at least partially define a chamber interior, a plurality of processing stations within the chamber interior that each include a substrate support structure configured to support a substrate, a hub having a plurality of channels in a top surface of the hub, the hub located in a center area of the chamber interior, a hub positioning mechanism configured to rotate the hub about a center axis, and a cleaning chemistry inlet configured to direct a flow of a cleaning chemistry into the chamber interior and onto the top surface of the hub;

a remote cleaning chemistry source fluidically connected to the cleaning chemistry inlet and configured to flow the cleaning chemistry to the cleaning chemistry inlet; and a controller having at least one processor and at least one memory, wherein the at least one memory stores instructions which, when executed by the at least one processor, cause the at least one processor to:

cause, while the hub is at a first angular position with respect to the center axis, the cleaning chemistry to flow from the remote cleaning chemistry source through the cleaning chemistry inlet and onto the top surface of the hub, thereby causing the cleaning chemistry to flow through at least some channels of the plurality of channels and into a plurality of first regions within the chamber interior, wherein each channel of the at least some channels directs the cleaning chemistry flow into one corresponding first region;

cause, after the cleaning chemistry is flowed onto the hub while the hub is at the first angular position, the hub positioning mechanism to rotate the hub by a first angle to a second angular position with respect to the center axis; and cause, while the hub is at the second angular position, the cleaning chemistry to flow through cleaning chemistry inlet and onto the top surface of the hub, thereby causing the cleaning chemistry to flow through at least some channels of the plurality of channels and into a plurality of second regions within the chamber interior, wherein each channel of the at least some channels directs the cleaning chemistry flow into one corresponding second region.

16. The system of claim 15, wherein the one or more memories further store instructions which, when executed by the at least one processor, further cause the at least one processor to cause, before the cleaning chemistry is flowed onto the top surface of the hub while the hub is at the first angular position, the hub positioning mechanism to position the hub at the first angular position with respect to the center axis.

17. The system of claim 15, wherein the one or more memories further store instructions which, when executed by the at least one processor, cause the at least one processor to cause, after the flowing of the cleaning chemistry onto the top surface of the hub while the hub is at the first angular position and before the rotating, the flow of the cleaning chemistry to stop flowing onto the hub.

18. The system of claim 15, wherein:

the hub positioning mechanism is further configured to raise and lower the hub along the center axis, and the one or more memories further store instructions which, when executed by the at least one processor, cause the at least one processor to cause, after the cleaning chemistry is flowed onto the top surface of the hub while the hub is at the first angular position and before the hub is rotated, the hub positioning mechanism to raise the hub along the center axis such that a first vertical offset between the hub and the top of the multi-station processing chamber decreases to a second vertical offset smaller than the first vertical offset and the hub to be rotated from the first angular position to the second angular position while the hub is at the second vertical offset, and the one or more memories further store instructions which, when executed by the at least one processor, cause the at least one processor, cause, after the hub is rotated, the hub positioning mechanism to lower the hub along the center axis from the second vertical offset to the first vertical offset.

19. The system of claim 18, wherein:

each substrate support structure is configured to be raised and lowered along a respective center axis that extends through each substrate support structure, the one or more memories further store instructions configured to cause, after the cleaning chemistry is flowed onto the hub while the hub is at the first angular position and before the hub is rotated, each substrate support structure to move upwards along each respective center axis such that a third vertical offset between each substrate support structure and the top of the multi-station processing chamber decreases to a fourth vertical offset smaller than the third vertical offset, the hub is rotated from the first angular position to the second angular position while the hub is at the second vertical offset and while each substrate support is at the fourth vertical offset, and the one or more memories further store instructions which, when executed by the at least one processor, cause the at least one processor to cause, after the hub is rotated, each substrate support structure to move downwards from the fourth vertical offset to the third vertical offset.

20. The system of claim 15, wherein the one or more memories further store instructions which, when executed by the at least one processor, cause the at least one processor to:

cause, after the cleaning chemistry is flowed onto the hub while the hub is at the second angular position, the hub positioning mechanism to rotate the hub by a second angle to a third angular position with respect to the center axis; and cause, while the hub is at the third angular position, the cleaning chemistry to flow through the cleaning chemistry inlet and onto the hub, and thereby cause the cleaning chemistry to flow through the at least some channels of the plurality of channels and into a plurality of third regions within the chamber interior, wherein each channel of the at least some channels of the plurality of channels directs the cleaning chemistry flow into one corresponding third region.

21. The system of claim 15, wherein the hub includes four channels.

22. The system of claim 15, wherein the hub includes eight channels.

23. The system of claim 15, wherein:

the plurality of channels includes a first set of channels and a second set of channels, the channels in the first set of channels are in a first circular array about the center axis, the channels in the second set of channels are in a second circular array about the center axis, the channels in the first set of channels each have a first cross-sectional profile in a corresponding plane that is coincident with, and parallel to, the center axis, the channels in the second set of channels each have a second cross-sectional profile in a corresponding plane that is coincident with, and parallel to, the center axis, the first cross-sectional profiles are different from the second cross-sectional profiles, the cleaning chemistry inlet has a plurality of flow outlets that are configured to direct the cleaning chemistry along a plurality of flow paths that are each at least partially at an oblique angle to an axis parallel to the center axis, the flow outlets of the cleaning chemistry inlet are, in the first angular position, aligned with the channels in the first set of channels, and the flow outlets of the cleaning chemistry inlet are, in the second angular position, aligned with the channels in the second set of channels.

24. The system of claim 23, wherein:

the hub is part of an indexer having a plurality of indexer arms, each indexer arm extends outward from the hub, the channels in the first set of channels are azimuthally aligned with the indexer arms, and the channels in the second set of channels are azimuthally aligned with sectors in between the indexer arms.

25. The system of claim 23, wherein the first cross-sectional profiles are configured to direct the cleaning chemistry flowed from the cleaning chemistry inlet in a direction that has a radially outward component relative to the center axis and a component that is parallel to the center axis and oriented towards the cleaning chemistry inlet.

26. The system of claim 23, wherein the second cross-sectional profiles are configured to direct the cleaning chemistry flowed from the cleaning chemistry inlet in a direction that has a radially outward component relative to the center axis and, optionally, a component that is parallel to the center axis and oriented away from the cleaning chemistry inlet.

27. A multi-station semiconductor processing system comprising:

a chamber having a plurality of processing stations within a chamber interior of the chamber;

a structure located in the chamber interior and configured to be moveable along a vertical center axis;

a cleaning chemistry inlet configured to direct a cleaning chemistry from a remote source into the chamber interior and onto the structure; and a controller having at least one processor and at least one memory, wherein:

the at least one memory stores instructions which, when executed by the at least one processor, cause the at least one processor to:

cause, while the structure is at a first elevational position with respect to the cleaning chemistry inlet, the cleaning chemistry to flow from the remote source through the cleaning chemistry inlet and onto the structure, thereby causing the cleaning chemistry to be directed along a first outward direction;

cause the structure to move from the first elevational position to a second elevational position; and cause, while the structure is at the second elevational position with respect to the cleaning chemistry inlet, the cleaning chemistry to flow from the remote source through the cleaning chemistry inlet and onto the structure, thereby causing the cleaning chemistry to be directed along a second outward direction, wherein the first outward direction and the second outward direction are different.

* * * * *